(12) United States Patent
Kinoshita et al.

(10) Patent No.: US 12,126,274 B2
(45) Date of Patent: Oct. 22, 2024

(54) BIDIRECTIONAL SWITCH, ELECTRICAL DEVICE, AND MULTI-LEVEL INVERTER

(71) Applicant: PANASONIC INTELLECTUAL PROPERTY MANAGEMENT CO., LTD., Osaka (JP)

(72) Inventors: Yusuke Kinoshita, Kyoto (JP); Yasuhiro Yamada, Tokyo (JP); Takashi Ichiryu, Osaka (JP); Masanori Nomura, Osaka (JP); Hidetoshi Ishida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 798 days.

(21) Appl. No.: 17/290,489

(22) PCT Filed: Aug. 23, 2019

(86) PCT No.: PCT/JP2019/032985
§ 371 (c)(1),
(2) Date: Apr. 30, 2021

(87) PCT Pub. No.: WO2020/095510
PCT Pub. Date: May 14, 2020

(65) Prior Publication Data
US 2021/0408934 A1 Dec. 30, 2021

(30) Foreign Application Priority Data

Nov. 8, 2018 (JP) .................. 2018-210724
Jan. 31, 2019 (JP) .................. 2019-016440
Apr. 18, 2019 (JP) .................. 2019-079572

(51) Int. Cl.
*H02M 7/483* (2007.01)
*H01L 29/778* (2006.01)
*H02M 1/08* (2006.01)

(52) U.S. Cl.
CPC ........ *H02M 7/483* (2013.01); *H01L 29/7786* (2013.01); *H02M 1/08* (2013.01)

(58) Field of Classification Search
CPC . H01L 27/04; H01L 21/822; H01L 29/42316; H01L 29/2003; H01L 29/7786; H02M 7/483
See application file for complete search history.

(56) References Cited

U.S. PATENT DOCUMENTS

2011/0305054 A1\* 12/2011 Yamagiwa .......... H01L 29/7787
363/125
2012/0217542 A1 8/2012 Morita
(Continued)

FOREIGN PATENT DOCUMENTS

JP 2011-172298 A 9/2011
JP 2011-204993 A 10/2011
(Continued)

OTHER PUBLICATIONS

International Search Report and Written Opinion issued in International Patent Application No. PCT/JP2019/032985, dated Nov. 12, 2019; with partial English translation.

*Primary Examiner* — Raj R Gupta
(74) *Attorney, Agent, or Firm* — Rimon P.C.

(57) ABSTRACT

A GaN layer is formed over the substrate. An AlGaN layer is formed on the GaN layer. A first source electrode, a first gate electrode, a second gate electrode, and a second source electrode are formed on or over the AlGaN layer. A first p-type $Al_{x1}Ga_{1-x1}N$ layer where $0 \leq x1 < 1$ is interposed between the first gate electrode and the AlGaN layer. A second p-type $Al_{x2}Ga_{1-x2}N$ layer where $0 \leq x2 < 1$ is inter-
(Continued)

posed between the second gate electrode and the AlGaN layer. The substrate is electrically insulated from all of the first source electrode, the second source electrode, the first gate electrode, and the second gate electrode. The bidirectional switch further includes a terminal used to connect the substrate to a fixed potential node. The terminal is connected to the substrate.

5 Claims, 23 Drawing Sheets

(56) References Cited

U.S. PATENT DOCUMENTS

| | | |
|---|---|---|
| 2013/0009676 A1 | 1/2013 | Morita et al. |
| 2014/0362626 A1 | 12/2014 | Kidera |
| 2016/0093691 A1 | 3/2016 | Echigoya et al. |
| 2019/0006499 A1 | 1/2019 | Kinoshita et al. |

FOREIGN PATENT DOCUMENTS

| | | |
|---|---|---|
| JP | 2012-004253 A | 1/2012 |
| JP | 2015-207610 A | 11/2015 |
| WO | 2011/064955 A1 | 6/2011 |
| WO | 2013/099053 A1 | 7/2013 |
| WO | 2017-159559 A1 | 9/2017 |

* cited by examiner

BIDIRECTIONAL SWITCH, ELECTRICAL DEVICE, AND MULTI-LEVEL INVERTER

CROSS-REFERENCE OF RELATED APPLICATIONS

This application is the U.S. National Phase under 35 U.S.C. § 371 of International Patent Application No. PCT/JP2019/032985, filed on Aug. 23, 2019, which in turn claims the benefit of Japanese Application No. 2018-210724, filed on Nov. 8, 2018, Japanese Application No. 2019-016440, filed on Jan. 31, 2019 and Japanese Application No. 2019-079572, filed on Apr. 18, 2019, the entire disclosures of which Applications are incorporated by reference herein.

TECHNICAL FIELD

The present disclosure generally relates to a bidirectional switch, an electrical device, and a multi-level inverter, and more particularly relates to a bidirectional switch including two gate electrodes, an electrical device including the bidirectional switch, and a multi-level inverter including the bidirectional switch.

BACKGROUND ART

A bidirectional switch element, which is a double-gate (also called "dual-gate") semiconductor element, has been proposed in the art (see, for example, Patent Literature 1).

In the bidirectional switch element of Patent Literature 1, a semiconductor multilayer structure is formed over an electrically conductive substrate of silicon with a buffer layer of AlN interposed between the substrate and the multilayer structure. In the semiconductor multilayer structure, a first layer of undoped GaN (GaN layer) and a second layer of undoped AlGaN (AlGaN layer) are stacked in this order from the bottom.

In the bidirectional switch element of Patent Literature 1, a channel region as a two-dimensional electron gas layer is generated in the vicinity of a heterojunction between the first layer and the second layer.

On the semiconductor multilayer structure, a first ohmic electrode (first source electrode) and a second ohmic electrode (second source electrode) are arranged to be spaced apart from each other. In a region between the first and second ohmic electrodes on the semiconductor multilayer structure, a first gate electrode, formed over the semiconductor multilayer structure with a first p-type nitride semiconductor layer interposed, and a second gate electrode, formed over the semiconductor multilayer structure with a second p-type nitride semiconductor layer interposed, are arranged side by side from the first ohmic electrode toward the second ohmic electrode.

When used with its substrate electrically floating, for example, the bidirectional switch element of Patent Literature 1 may produce a current collapse that causes an increase in its ON-state resistance at the time of switching. As used herein, the "current collapse" is a phenomenon that causes an increase in ON-state resistance due to trapping of electrons in crystal imperfections, interfaces, and other sites in the vicinity of a channel region when high voltage (stress voltage) is applied across the first ohmic electrode (first source electrode) and the second ohmic electrode (second source electrode).

CITATION LIST

Patent Literature

Patent Literature 1: JP 2011-204993 A

SUMMARY OF INVENTION

It is therefore an object of the present disclosure to provide a bidirectional switch, an electrical device, and a multi-level inverter, all of which have the ability to reduce the current collapse.

A bidirectional switch according to an aspect of the present disclosure includes a substrate, a GaN layer, an AlGaN layer, a first source electrode, a first gate electrode, a second gate electrode, a second source electrode, a first p-type $Al_{x1}Ga_{1-x1}N$ layer (where $0 \leq x1 < 1$), and a second p-type $Al_{x2}Ga_{1-x2}N$ layer (where $0 \leq x2 < 1$). The substrate has electrical conductivity. The GaN layer is formed over the substrate. The AlGaN layer is formed on the GaN layer. The first source electrode, the first gate electrode, the second gate electrode, and the second source electrode are formed on or over the AlGaN layer. The first p-type $Al_{x1}Ga_{1-x1}N$ layer is interposed between the first gate electrode and the AlGaN layer. The second p-type $Al_{x2}Ga_{1-x2}N$ layer is interposed between the second gate electrode and the AlGaN layer. The substrate is electrically insulated from all of the first source electrode, the second source electrode, the first gate electrode, and the second gate electrode. The bidirectional switch further includes a terminal used to connect the substrate to a fixed potential node. The terminal is connected to the substrate.

An electrical device according to another aspect of the present disclosure includes the bidirectional switch described above. The terminal of the bidirectional switch is connected to the fixed potential node.

A multi-level inverter according to still another aspect of the present disclosure includes the bidirectional switch described above.

DESCRIPTION OF EMBODIMENTS

Figure 1:
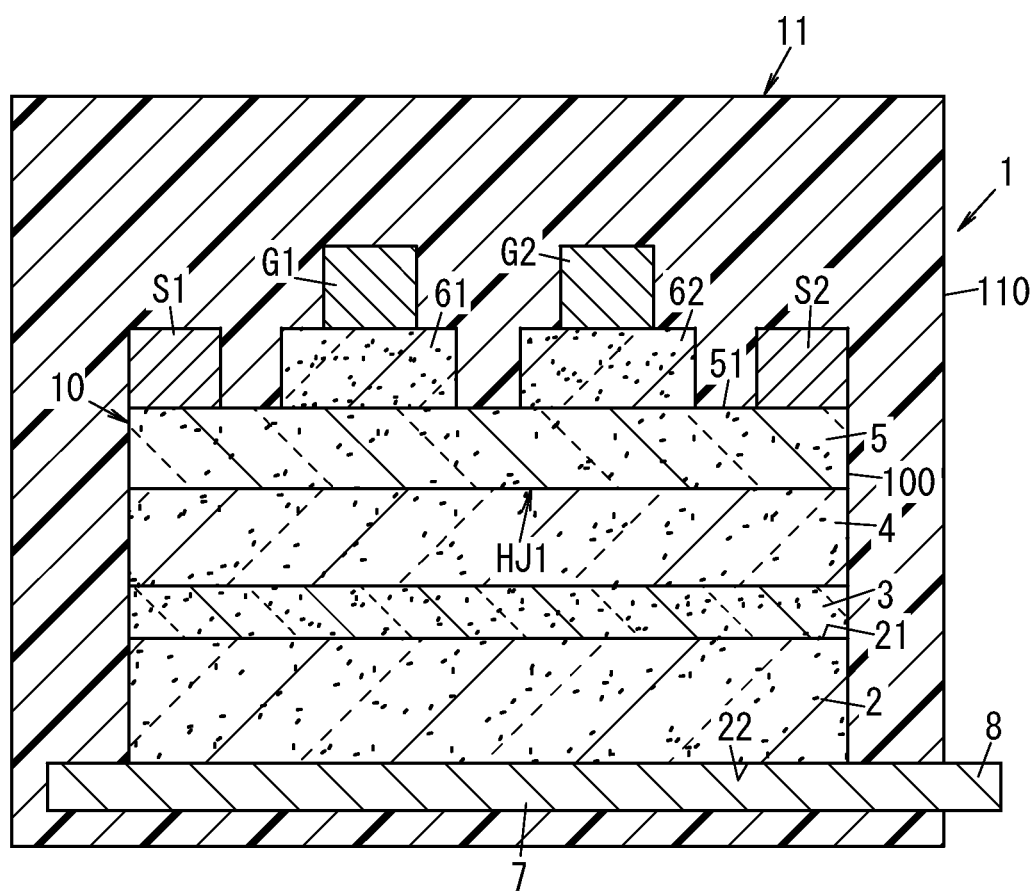
FIG. 1 is a cross-sectional view of a bidirectional switch according to a first embodiment.
Figure 8:
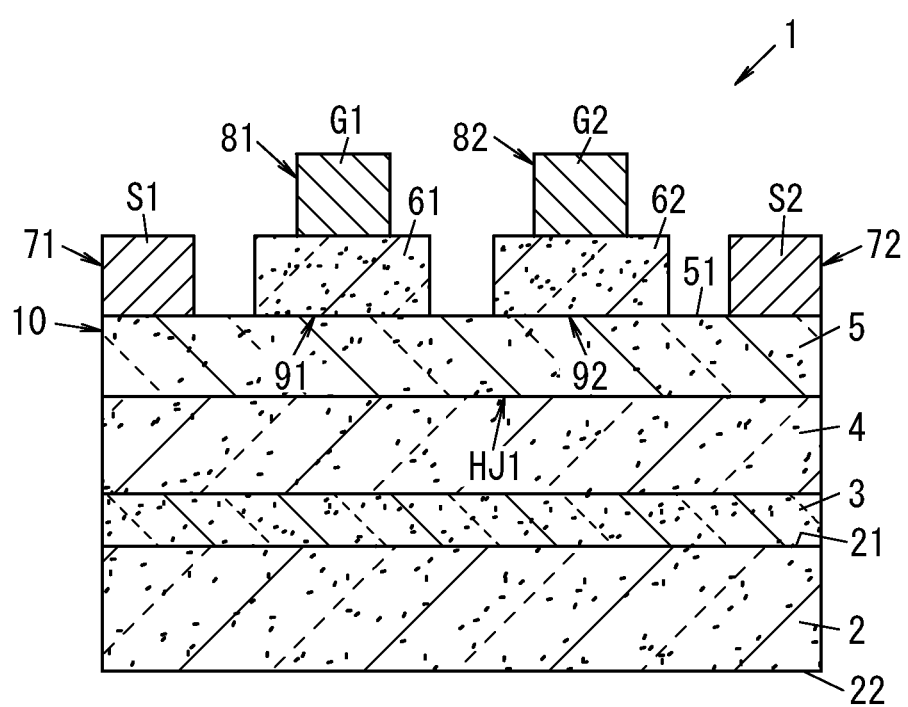
FIG. 8 is a cross-sectional view of a bidirectional switch included in a bidirectional switch device of the switch system.

FIGS. 1 and 8 to be referred to in the following description of embodiments and their variations are all schematic representations. That is to say, the ratio of the dimensions (including thicknesses) of respective constituent elements illustrated in FIGS. 1 and 8 does not always reflect their actual dimensional ratio.

First Embodiment

A bidirectional switch 1 according to a first embodiment will be described with reference to FIG. 1.

(1.1) Overview

The bidirectional switch 1 includes a bidirectional switch element 10 and a package 11 to protect the bidirectional switch element 10. The bidirectional switch element 10 includes a substrate 2, a GaN layer 4, an AlGaN layer 5, a first source electrode S1, a first gate electrode G1, a second gate electrode G2, a second source electrode S2, a first p-type $Al_{x1}Ga_{1-x1}N$ layer 61 (where $0 \leq x1 < 1$), and a second p-type $Al_{x2}Ga_{1-x2}N$ layer 62 (where $0 \leq x2 < 1$). In the bidirectional switch 1 according to the first embodiment, $x1 = x2$. The package 11 includes a first source terminal, a first gate terminal, a second source terminal, and a second gate terminal, to which the first source electrode S1, first gate electrode G1, second source electrode S2, and second gate electrode G2 of the bidirectional switch element 10 are respectively connected. The package 11 further includes a terminal 8 connected to the substrate 2 of the bidirectional switch element 10.

In the bidirectional switch element 10, the GaN layer 4 is formed over the substrate 2. The AlGaN layer 5 formed on the GaN layer 4. The first source electrode S1, the first gate electrode G1, the second gate electrode G2, and the second source electrode S2 are formed on or over the AlGaN layer 5. The first p-type $Al_{x1}Ga_{1-x1}N$ layer 61 is interposed between the first gate electrode G1 and the AlGaN layer 5. The second p-type $Al_{x2}Ga_{1-x2}N$ layer 62 is interposed between the second gate electrode G2 and the AlGaN layer 5. Thus, in this bidirectional switch element 10, a multilayer stack 100 including the GaN layer 4, the AlGaN layer 5, the first p-type $Al_{x1}Ga_{1-x1}N$ layer 61, and the second p-type $Al_{x1}Ga_{1-x1}N$ layer 62, is formed on the substrate 2.

The bidirectional switch element 10 may be implemented as, for example, a dual-gate GaN-based gate injection transistor (GIT). In the bidirectional switch element 10 of this embodiment, the AlGaN layer 5 is formed on the GaN layer 4 and forms, along with the GaN layer 4, a heterojunction HJ1. In a region, located near the heterojunction HJ1, of the GaN layer 4, a two-dimensional electron gas has been produced. The region including the two-dimensional electron gas (hereinafter also referred to as a "two-dimensional electron gas layer") may serve as an n-channel layer (electron conduction layer).

(1.2) Respective Constituent Elements of Bidirectional Switch

Next, respective constituent elements of the bidirectional switch 1 will be described in further detail.

(1.2.1) Bidirectional Switch Element (1.2.1.1) Substrate

The substrate 2 is an electrically conductive silicon substrate. Thus, the substrate 2 is a type of electrically conductive substrate.

The substrate 2 has a first principal surface 21 and a second principal surface 22. The first principal surface 21 and second principal surface 22 of the substrate 2 are perpendicular to the thickness direction defined for the substrate 2. As used herein, if these surfaces are "perpendicular to" the thickness direction, the surfaces may naturally be exactly perpendicular to the thickness direction but may also be substantially perpendicular to the thickness direction (e.g., when the angle formed between the thickness direction and the first or second principal surface 21, 22 is 90±5 degrees). The second principal surface 22 is located opposite from the first principal surface 21 in the thickness direction defined for the substrate 2. The first principal surface 21 and the second principal surface 22 face each other. As used herein, if two surfaces "face each other," it means that the two surfaces face each other geometrically, not physically. In the bidirectional switch element 10, the multilayer stack 100 is formed on the first principal surface 21 of the substrate 2. The first principal surface 21 of the substrate 2 may be a (111) plane, for example. Alternatively, the first principal surface 21 of the substrate 2 may also be a crystallographic plane, of which an off-axis angle with respect to the (111) plane is greater than 0 degrees and equal to or less than 5 degrees. As used herein, the "off-axis angle" indicates a tilt angle defined by the first principal surface 21 with respect to the (111) plane. Thus, if the off-axis angle is 0 degrees, then the first principal surface 21 is a (111) plane. The (111) plane is a crystallographic plane represented by three Miller indices enclosed in parentheses. The substrate 2 may have a thickness of 100 μm to 1000 μm, for example.

The substrate 2 is electrically insulated from all of the first source electrode S1, the second source electrode S2, the first gate electrode G1, and the second gate electrode G2.

(1.2.1.2) Multilayer Stack

The GaN layer 4 is formed over the substrate 2 with a buffer layer 3 interposed between them. In this embodiment, the multilayer stack 100 includes the buffer layer 3. In this multilayer stack 100, the buffer layer 3, the GaN layer 4, and the AlGaN layer 5 are arranged in this order such that the buffer layer 3 is located closer to the substrate 2 than any other layer of the multilayer stack 100 is. The AlGaN layer 5 has a larger bandgap than the GaN layer 4.

The multilayer stack 100 includes a first p-type $Al_{x1}Ga_{1-x1}N$ layer 61 and a second p-type $Al_{x2}Ga_{1-x2}N$ layer 62, which are formed on the AlGaN layer 5. The first p-type $Al_{x1}Ga_{1-x1}N$ layer 61 and the second p-type $Al_{x2}Ga_{1-x2}N$ layer 62 each cover only a part of the surface 51 of the AlGaN layer 5. Thus, the surface 51 of the AlGaN layer 5 includes regions covered with the first p-type $Al_{x1}Ga_{1-x1}N$ layer 61 and the second p-type $Al_{x2}Ga_{1-x2}N$ layer 62 and regions covered with neither the first p-type $Al_{x1}Ga_{1-x1}N$ layer 61 nor the second p-type $Al_{x2}Ga_{1-x2}N$ layer 62. The first p-type $Al_{x1}Ga_{1-x1}N$ layer 61 and the second p-type $Al_{x2}Ga_{1-x2}N$ layer 62 are spaced apart from each other. The first p-type $Al_{x1}Ga_{1-x1}N$ layer 61 and the second p-type $Al_{x2}Ga_{1-x2}N$ layer 62 contain Mg.

In this bidirectional switch element 10, each of the first p-type $Al_{x1}Ga_{1-x1}N$ layer 61 and the second p-type $Al_{x2}Ga_{1-x2}N$ layer 62 may be a p-type AlGaN layer, for example.

However, this is only an example and should not be construed as limiting. Alternatively, each of the first p-type $Al_{x1}Ga_{1-x1}N$ layer 61 and the second p-type $Al_{x2}Ga_{1-x2}N$ layer 62 may also be a p-type GaN layer.

The multilayer stack 100 includes epitaxially grown layers grown on the substrate 2 by metalorganic vapor phase epitaxy (MOVPE), for example. When an MOVPE system is used as an epitaxial growth system for growing the multilayer stack 100 on the substrate 2, trimethylaluminum (TMAl) is suitably used as an Al source gas, trimethylgallium (TMGa) is suitably used as a Ga source gas, and $NH_3$ is suitably used as an N source gas. As a source gas for Mg, which is a dopant imparting p-type conductivity, bis(cyclopentadienyl)magnesium ($Cp_2Mg$) is suitably used. A carrier gas for the respective source gases is suitably an $H_2$ gas, for example. The source gases are not particularly limited to the ones exemplified above. Alternatively, triethylgallium (TEGa) may also be used as a Ga source gas, and a hydrazine derivative may also be used as an N source gas, for example.

The buffer layer 3 may be an undoped GaN layer, for example. The buffer layer 3 is provided for the purpose of improving the crystallinity of the GaN layer 4, the AlGaN layer 5, the first p-type $Al_{x1}Ga_{1-x1}N$ layer 61, and the second p-type $Al_{x2}Ga_{1-x2}N$ layer 62.

The buffer layer 3 is formed directly on the first principal surface 21 of the substrate 2.

The undoped GaN layer serving as the buffer layer 3 may include Mg, H, Si, C, O, and other impurities to be inevitably contained therein during its growth. The buffer layer 3 may have a thickness of 100 nm to 3000 nm, for example.

The GaN layer 4 is an undoped GaN layer. The undoped GaN layer serving as the GaN layer 4 may include Mg, H, Si, C, O, and other impurities to be inevitably contained therein during its growth. The GaN layer 4 may have a thickness of 100 nm to 700 nm, for example.

The AlGaN layer 5 is an undoped AlGaN layer. The undoped AlGaN layer serving as the AlGaN layer 5 may include Mg, H, Si, C, O, and other impurities to be inevitably contained therein during its growth. The AlGaN layer 5 may have an Al composition ratio of 0.2, for example. As used herein, the "Al composition ratio" of the AlGaN layer 5 refers to a y value when the undoped AlGaN layer is expressed by the general formula $Al_yGa_{1-y}N$. That is to say, the AlGaN layer 5 is an undoped $Al_{0.2}Ga_{0.8}N$ layer. The composition ratio may be a value obtained by composition analysis according to energy dispersive X-ray spectroscopy (EDX). When their magnitudes are discussed, the composition ratios do not have to be values obtained by the EDX but may also be values obtained by composition analysis according to Auger electron spectroscopy or composition analysis according to secondary ion mass spectroscopy (SIMS), for example. The AlGaN layer 5 may have a thickness falling within the range from 20 nm to 100 nm, for example.

The first p-type $Al_{x1}Ga_{1-x1}N$ layer 61 and the second p-type $Al_{x2}Ga_{1-x2}N$ layer 62 are formed by growing, using an MOVPE system, a p-type $Al_{x1}Ga_{1-x1}N$ layer as a prototype of the first p-type $Al_{x1}Ga_{1-x1}N$ layer 61 and the second p-type $Al_{x2}Ga_{1-x2}N$ layer 62 (where x=x1=x2) on the AlGaN layer 5 and then patterning the p-type $Al_{x1}Ga_{1-x1}N$ layer by photolithographic and etching techniques.

The Al composition ratio of the first p-type $Al_{x1}Ga_{1-x1}N$ layer 61 and second p-type $Al_{x2}Ga_{1-x2}N$ layer 62 may be the same as the Al composition ratio of the AlGaN layer 5 (and may be 0.2, for example). However, the Al composition ratio of the first p-type $Al_{x1}Ga_{1-x1}N$ layer 61 and second p-type $Al_{x2}Ga_{1-x2}N$ layer 62 may be different from that of the AlGaN layer 5. The first p-type $Al_{x1}Ga_{1-x1}N$ layer 61 and the second p-type $Al_{x2}Ga_{1-x2}N$ layer 62 may each have a thickness of 50 nm to 300 nm, for example.

(1.2.1.3) First Source Electrode, First Gate Electrode, Second Source Electrode, and Second Gate Electrode The first source electrode S1 is formed on the AlGaN layer 5. The first gate electrode G1 is formed over the AlGaN layer 5 and spaced from the first source electrode S1. The second gate electrode G2 is formed over the AlGaN layer 5 to be located opposite from the first source electrode S1 with respect to the first gate electrode G1 and spaced from the first gate electrode G1. The second source electrode S2 is formed on the AlGaN layer 5 to be located opposite from the first gate electrode G1 with respect to the second gate electrode G2 and spaced from the second gate electrode G2.

The first source electrode S1 and the second source electrode S2 are formed in regions, covered with neither the first p-type $Al_{x1}Ga_{1-x1}N$ layer 61 nor the second p-type $Al_{x2}Ga_{1-x2}N$ layer 62, of the surface 51 of the AlGaN layer 5. The first source electrode S1 and the second source electrode S2 are spaced apart from each other. The first source electrode S1 and the second source electrode S2 are electrically connected to the heterojunction HJ1. As used herein, if two members are "electrically connected together," then it means that the two members are in ohmic contact with each other. The first source electrode S1 and the second source electrode S2 may each contain Ti and Al, for example.

The first gate electrode G1 is formed over the AlGaN layer 5 with the first p-type $Al_{x1}Ga_{1-x1}N$ layer 61 interposed between the first gate electrode G1 and the AlGaN layer 5. The second gate electrode G2 is formed over the AlGaN layer 5 with the second p-type $Al_{x2}Ga_{1-x2}N$ layer 62 interposed between the second gate electrode G2 and the AlGaN layer 5. The interval between the first gate electrode G1 and the second gate electrode G2 is longer than the interval between the first p-type $Al_{x1}Ga_{1-x1}N$ layer 61 and the second p-type $Al_{x2}Ga_{1-x2}N$ layer 62. The first gate electrode G1 is associated with the first source electrode S1. The second gate electrode G2 is associated with the second source electrode S2. Each of the first gate electrode G1 and the second gate electrode G2 is spaced from an associated one of the first source electrode S1 and second source electrode S2 in the direction aligned with the surface 51 of the AlGaN layer 5. For example, the first gate electrode G1 and second gate electrode G2 may be in ohmic contact with the first p-type $Al_{x1}Ga_{1-x1}N$ layer 61 and the second p-type $Al_{x2}Ga_{1-x2}N$ layer 62, respectively. Each of the first gate electrode G1 and the second gate electrode G2 contains Pd and Au, for example.

In the bidirectional switch element 10, the first source electrode S1, the first gate electrode G1, the second gate electrode G2, and the second source electrode S2 are arranged side by side in this order in one direction aligned with a surface 51 of the AlGaN layer 5. The first source electrode S1, the first gate electrode G1, the second gate electrode G2, and the second source electrode S2 are spaced apart from each other in the one direction.

(1.2.1.4) Operation of Bidirectional Switch Element

In the following description, a state where no voltage equal to or higher than a first threshold voltage is applied across the first gate electrode G1 and the first source electrode S1 will be hereinafter referred to as a state where the first gate electrode G1 is OFF for the sake of convenience. On the other hand, a state where a voltage equal to or higher than the first threshold voltage is applied across the first gate electrode G1 and the first source electrode S1 with the first gate electrode G1 having the higher potential will be hereinafter referred to as a state where the first gate electrode G1 is ON. Also, a state where no voltage equal to or higher than a second threshold voltage is applied across the second gate electrode G2 and the second source electrode S2 will be hereinafter referred to as a state where the second gate electrode G2 is OFF. On the other hand, a state where a voltage equal to or higher than the second threshold voltage is applied across the second gate electrode G2 and the second source electrode S2 with the second gate electrode G2 having the higher potential will be hereinafter referred to as a state where the second gate electrode G2 is ON.

This bidirectional switch element 10 includes the first p-type $Al_{x1}Ga_{1-x1}N$ layer 61 and the second p-type $Al_{x2}Ga_{1-x2}N$ layer 62, thereby operating as a normally OFF transistor. In this case, when the first gate electrode G1 is OFF, the first p-type $Al_{x1}Ga_{1-x1}N$ layer 61 forms a depletion layer right under the first p-type $Al_{x1}Ga_{1-x1}N$ layer 61 such that the depletion layer runs through the AlGaN layer 5 to reach the GaN layer 4. When the second gate electrode G2 is OFF, the second p-type $Al_{x2}Ga_{1-x2}N$ layer 62 forms a depletion layer right under the second p-type $Al_{x2}Ga_{1-x2}N$ layer 62 such that the depletion layer runs through the AlGaN layer 5 to reach the GaN layer 4. In the state where the first gate electrode G1 is ON, the bidirectional switch element 10 may connect the first gate electrode G1 and the first source electrode SI with the two-dimensional electron gas layer. In other words, while the first gate electrode G1 is ON, the bidirectional switch element 10 prevents the depletion layer from cutting off the two-dimensional electron gas layer between the first gate electrode G1 and the first source electrode Si. In addition, in the state where the second gate electrode G2 is ON, the bidirectional switch element 10 may connect the second gate electrode G2 and the second source electrode S2 with the two-dimensional electron gas layer. In other words, while the second gate electrode G2 is ON, the bidirectional switch element 10 prevents the depletion layer from cutting off the two-dimensional electron gas layer between the second gate electrode G2 and the second source electrode S2.

In a state where the first gate electrode G1 is OFF and the second gate electrode G2 is OFF (i.e., in a first operation mode), the bidirectional switch element 10 is unable to allow a current to flow in any direction between the first source electrode S1 and the second source electrode S2. More specifically, in the first operation mode, a current flowing from the first source electrode S1 toward the second source electrode S2 is cut off when the first source electrode S1 has a higher potential than the second source electrode S2 and a current flowing from the second source electrode S2 toward the first source electrode S1 is also cut off when the second source electrode S2 has a higher potential than the first source electrode S1.

In a state where the first gate electrode G1 is ON and the second gate electrode G2 is ON (i.e., in a second operation mode), the bidirectional switch element 10 allows a current to flow bidirectionally between the first source electrode S1 and the second source electrode S2. More specifically, in the second operation mode, a current flows from the first source electrode S1 toward the second source electrode S2 when the first source electrode S1 has a higher potential than the second source electrode S2 and a current flows from the second source electrode S2 toward the first source electrode S1 when the second source electrode S2 has a higher potential than the first source electrode S1.

In a state where the first gate electrode G1 is ON and the second gate electrode G2 is OFF (i.e., in a third operation mode), the bidirectional switch element 10 functions as a diode. More specifically, in the third operation mode, a current flowing from the first source electrode SI toward the second source electrode S2 is cut off when the first source electrode S1 has a higher potential than the second source electrode S2 and a current flows from the second source electrode S2 toward the first source electrode S1 when the second source electrode S2 has a potential higher by at least the second threshold voltage than the first source electrode S1.

In a state where the first gate electrode G1 is OFF and the second gate electrode G2 is ON (i.e., in a fourth operation mode), the bidirectional switch element 10 functions as a diode. More specifically, in the fourth operation mode, a current flowing from the second source electrode S2 toward the first source electrode S1 is cut off when the second source electrode S2 has a higher potential than the first source electrode S1 and a current flows from the first source electrode Si toward the second source electrode S2 when the first source electrode Si has a potential higher by at least the first threshold voltage than the second source electrode S2.

In this bidirectional switch element 10, the first threshold voltage and the second threshold voltage have the same value. However, this is only an example and should not be construed as limiting. Alternatively, the first threshold voltage and the second threshold voltage may have mutually different values. The first threshold voltage is a threshold voltage at which the depletion layer expanding under the first gate electrode G1 to shut off the two-dimensional electron gas layer shrinks to the point of allowing a current to flow through the two-dimensional electron gas layer. The second threshold voltage is a threshold voltage at which the depletion layer expanding under the second gate electrode G2 to shut off the two-dimensional electron gas layer shrinks to the point of allowing a current to flow through the two-dimensional electron gas layer.

(1.2.2) Package

The package 11 includes a first source terminal, a first gate terminal, a second source terminal, and a second gate terminal, to which the first source electrode Si, first gate electrode G1, second source electrode S2, and second gate electrode G2 of the bidirectional switch element 10 are respectively connected via connecting members (e.g., bonding wires). The package 11 further includes a terminal 8 connected to the substrate 2 of the bidirectional switch element 10. The terminal 8 is used to connect the substrate 2 to a fixed potential node during an ON period of the bidirectional switch 1. The ON period of the bidirectional switch 1 means the ON period of the bidirectional switch element 10. The package 11 also includes a package body 110. The package body 110 may be formed in a generally rectangular parallelepiped shape, for example. The package body 110 has electrical insulation properties. The package body 110 is made of a resin with electrical insulation properties. The package body 110 may be made, for example, an encapsulation resin (such as an epoxy resin containing a black pigment) and has opacity.

The package 11 includes a conductive die pad 7 to mount the bidirectional switch element 10 thereon. The terminal 8 is formed integrally with, and is electrically connected to, the conductive die pad 7. Examples of materials for the conductive die pad 7 include copper and copper alloys. In the bidirectional switch 1 according to this embodiment, bonding the substrate 2 of the bidirectional switch element 10 to the conductive die pad 7 with an electrically conductive material allows the substrate 2 and the terminal 8 to be electrically connected together. Thus, in this bidirectional switch 1, the potential of the substrate 2 becomes as high as the potential of the terminal 8. Examples of electrically conductive materials include electrically conductive pastes (such as silver paste and gold paste).

In this package 11, the first source terminal, the first gate terminal, the second source terminal, the second gate terminal, and the terminal 8 are spaced from each other and electrically connected to each other.

(1.3) Characteristics of Bidirectional Switch

Figure 2:
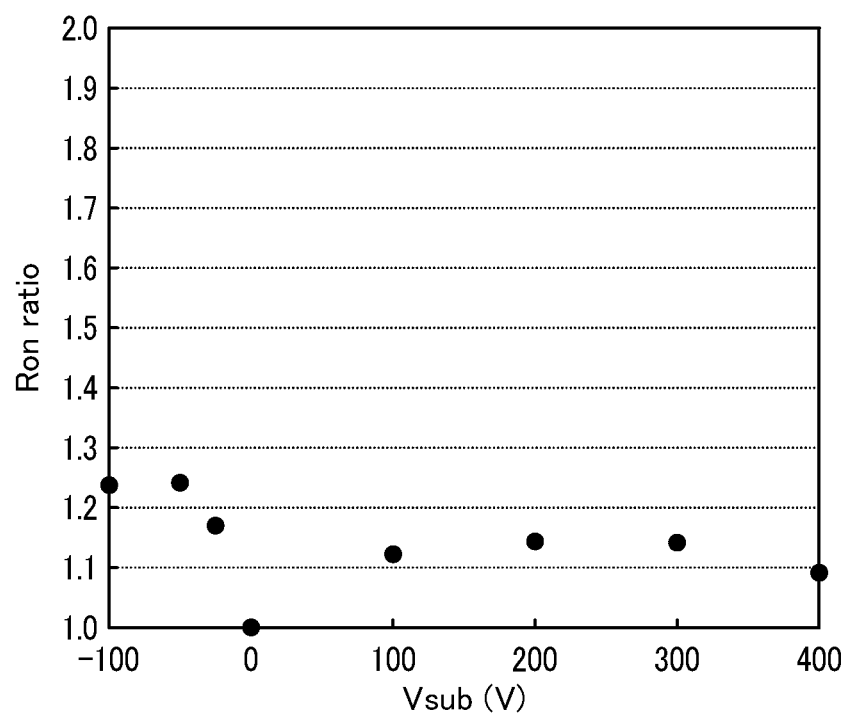
FIG. 2 is a graph showing a relationship between a substrate potential and an ON-state resistance ratio in the bidirectional switch.

FIG. 2 is a graph showing a relationship between the potential of the substrate 2 of the bidirectional switch 1 and the ON-state resistance ratio thereof. FIG. 2 shows the ON-state resistance (Ron) ratios, each of which is the ratio of ON-state resistance (Ron) of the bidirectional switch 1 to a reference ON-state resistance. The ON-state resistance (Ron) ratios were calculated with the substrate 2 connected to one terminal of a DC power supply via the terminal 8 to have a potential Vsub, which was set at a fixed potential of −100 V, 0 V, 100 V, 200 V, 300 V, or 400 V.

To calculate the ON-state resistance ratio, when the bidirectional switch 1 is turned ON by a control circuit with the potential of the substrate 2 set at a fixed potential, the bidirectional switch element 10 is controlled to cause a time lag (of 500 nsec, for example) between a first timing and a second timing. The first timing is a timing when a voltage (of 5 V, for example) equal to or higher than a threshold voltage is applied to either the first gate electrode G1 or the second gate electrode G2, which is associated with one source electrode with the lower potential selected from the first source electrode S1 and the second source electrode S2. The second timing is a timing when a voltage (of 5 V, for example) equal to or higher than the threshold voltage is applied to either the first gate electrode G1 or the second gate electrode G2, which is associated with the other source electrode with the higher potential selected from the first source electrode S1 and the second source electrode S2. Before the bidirectional switch 1 was turned ON, a stress voltage applied across the first source electrode S1 and the second source electrode S2 was set at 400 V. The current flowing between the first source electrode S1 and the second source electrode S2 when the bidirectional switch 1 was turned ON was 10 A. The ON-state resistance is a value that was obtained by Ohm's law based on the voltage and current between the first source electrode S1 and the second source electrode S2. The ON-state resistance ratio is obtained as {the ON-state resistance in 1 μsec after the bidirectional switch 1 has been turned ON with the potential of the substrate 2 of the bidirectional switch 1 set at the fixed potential Vsub, the stress voltage set at 400 V, and the current set at 10 A}/{the ON-state resistance in 1 μsec after the bidirectional switch 1 has been turned ON with the potential of the substrate 2 of the bidirectional switch 1 set at 0 V and the stress voltage set at 100 V}. The ON-state resistance in 1 μsec after the bidirectional switch 1 has been turned ON with the potential of the substrate 2 of the bidirectional switch 1 set at 0 V (i.e., grounded) and the stress voltage set at 100V is substantially equal to the ON-state resistance when no current collapse is caused.

Although not shown in FIG. 2, when the potential of the substrate 2 is set at a floating potential, the ON-state resistance ratio is 5. In this case, when the potential of the substrate 2 is set at a floating potential, the ON-state resistance ratio is obtained as {the ON-state resistance in 1 μsec after the bidirectional switch 1 has been turned ON with the potential of the substrate 2 of the bidirectional switch 1 set at the floating potential, the stress voltage set at 400 V, and the current set at 10 A}/{the ON-state resistance in 1 μsec after the bidirectional switch 1 has been turned ON with the potential of the substrate 2 of the bidirectional switch 1 set at 0 V and the stress voltage set at 100 V}. As can be seen from FIG. 2, setting the potential of the substrate 2 at a fixed potential allows the ON-state resistance ratio to be reduced to approximately one-fifth, compared to setting the potential of the substrate 2 at the floating potential.

Figure 3:
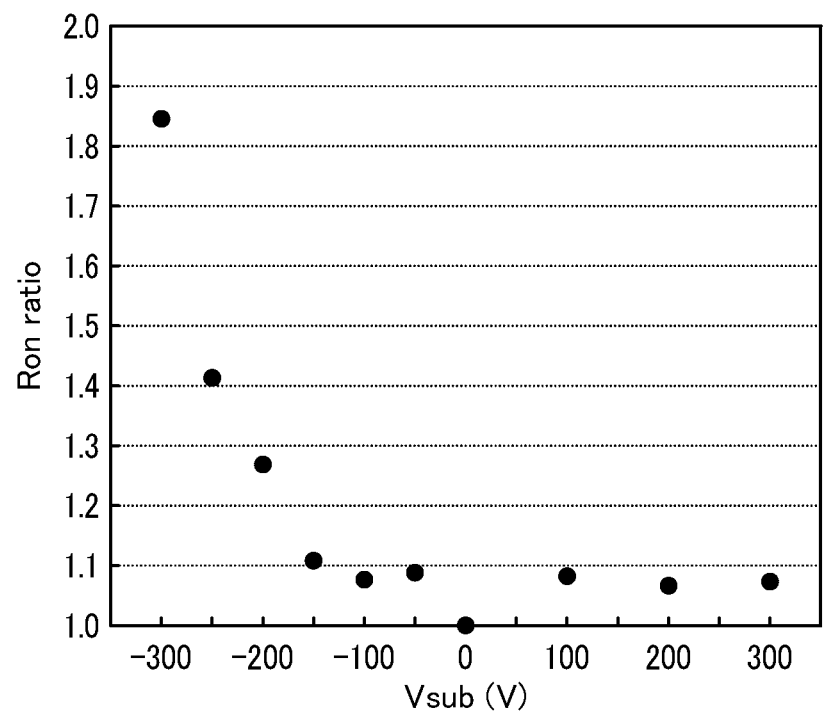
FIG. 3 is a graph showing another relationship between the substrate potential and the ON-state resistance ratio in the bidirectional switch.

FIG. 3 is a graph showing a relationship between the potential of the substrate 2 of the bidirectional switch 1 having the same configuration as the bidirectional switch 1, from which the results shown in FIG. 2 were obtained, and the ON-state resistance ratio. Nevertheless, FIGS. 3 and 2 show measurement results obtained from two different samples (bidirectional switches 1).

In FIG. 3, as well as in FIG. 2, the substrate 2 was connected to one terminal of a DC power supply via the terminal 8 to set the potential of the substrate 2 at Vsub. Also, in FIG. 3, the ON-state resistance ratio (Ron ratio) is obtained in the same way as in FIG. 2.

As can be seen from FIG. 3, if the potential of the substrate 2 is positive, then the ON-state resistance ratio is generally constant, even after the absolute value of the potential of the substrate 2 has become greater than 200 V. On the other hand, if the potential of the substrate 2 is negative, the ON-state resistance ratio tends to start increasing, once the absolute value of the potential of the substrate 2 increasing reaches about 200 V. Although not shown in FIG. 3, when the potential of the substrate 2 is set at the floating potential, then the ON-state resistance ratio is 3.8.

As can be seen from FIG. 3, if the potential at a fixed potential node, which is supposed to have the potential of the substrate 2, is a negative potential with respect to the ground as the reference potential and the absolute value of the negative potential is equal to or less than a predetermined value (e.g., 150 V), then the bidirectional switch 1 may reduce the current collapse. Note that the predetermined value may vary according to the thickness of the substrate 2 of the bidirectional switch 1, the thickness of the multilayer stack 100, the crystal structure of the multilayer stack 100, a difference in the crystallinity of the multilayer stack 100, and other factors. As used herein, the "crystal structure of the multilayer stack 100" refers to the crystal structure of crystals that form the GaN layer 4, AlGaN layer 5, first p-type $Al_{x1}Ga_{1-x1}N$ layer 61, and second p-type $Al_{x2}Ga_{1-x2}N$ layer 62 which are included in the multilayer stack 100. As used herein, the "crystallinity of the multilayer stack 100" refers to the crystallinity of crystals that form the GaN layer 4, AlGaN layer 5, first p-type $Al_{x1}Ga_{1-x1}N$ layer 61, and second p-type $Al_{x2}Ga_{1-x2}N$ layer 62 which are included in the multilayer stack 100.

Figure 4:
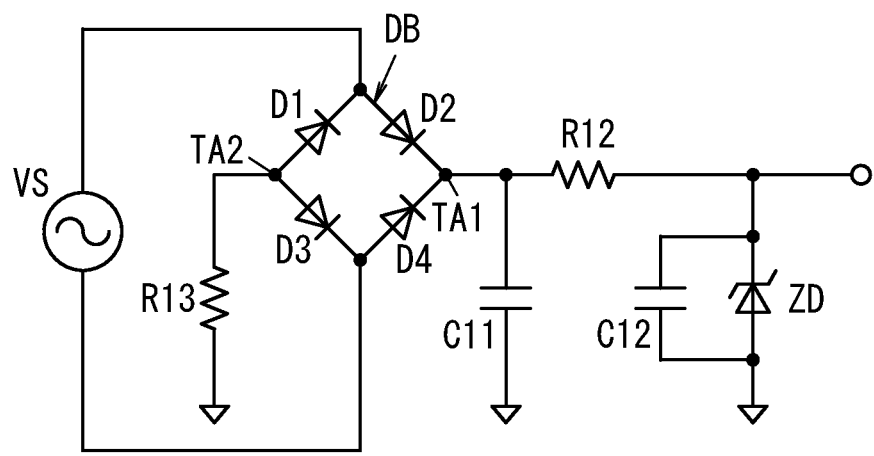
FIG. 4 is a circuit diagram illustrating an exemplary fixed potential node to which a terminal of the bidirectional switch is connected.

The destination to which the terminal 8 of the bidirectional switch 1 is connected may be determined in a constant-voltage circuit such as the one shown in FIG. 4, for example. The constant-voltage circuit shown in FIG. 4 is a circuit for generating a predetermined DC voltage based on an AC voltage supplied from an AC power supply Vs.

The AC power supply Vs may be a commercial power supply, for example. The constant-voltage circuit shown in FIG. 4 includes: a diode bridge DB for full-wave rectifying an AC voltage supplied from an AC power supply Vs; a capacitor (smoothing capacitor) C11 connected between a pair of output terminals TA1, TA2 of the diode bridge DB; a series circuit of a resistor R12 and a Zener diode ZD, which is connected between both terminals of the capacitor C11; and a capacitor C12 connected to the Zener diode ZD in parallel. The diode bridge DB includes four diodes D1-D4, which are connected together to form a bridge. The constant-voltage circuit includes a rectifier smoothing circuit including the diode bridge DB and the smoothing capacitor. The constant voltage circuit further includes another resistor R13 connected between the low-potential output terminal of the diode bridge DB and the ground.

Figure 5:
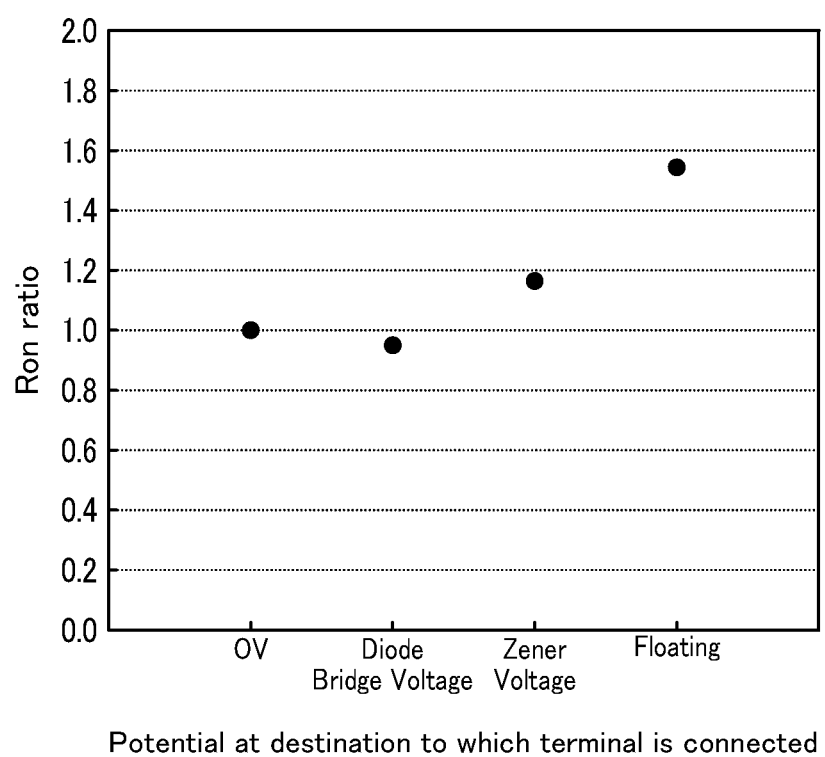
FIG. 5 is a graph showing a relationship between potentials at respective destinations to which the terminal of the bidirectional switch is connected and the ON-state resistance ratio.

The ON-state resistance of the bidirectional switch 1 was obtained with an AC power supply of 200 V connected between the first source electrode Si and second source electrode S2 of the bidirectional switch 1 and with the terminal 8 of the bidirectional switch 1 regarded as a fixed potential node and connected to the ground of the constant-voltage circuit, the higher-potential output terminal TA1 of the diode bridge DB (i.e., the higher-potential output terminal of the rectifier smoothing circuit), and the cathode of the Zener diode ZD. The ON-state resistance ratios of the ON-state resistances thus obtained were calculated. The results are shown in FIG. 5. In FIG. 5, the "potential at destination to which terminal is connected" indicates the potential at the destination to which the terminal 8 of the bidirectional switch 1 is connected. In this example, "0 V" shown in FIG. 5 indicates the ground potential of the constant-voltage circuit. Also, the "diode bridge voltage" shown in FIG. 5 indicates the potential at the higher-potential output terminal TA1 of the diode bridge DB. Furthermore, the "Zener voltage" shown in FIG. 5 indicates the cathode potential of the Zener diode ZD. Furthermore, the "floating" shown in FIG. 5 indicates a situation where the potential of the substrate 2 is floating. When the ON-state resistance was obtained, the stress voltage applied across the first source electrode Si and the second source electrode S2 before the bidirectional switch 1 was turned ON was 200 V. The ON-state resistance ratio shown in FIG. 5 was obtained based on the ON-state resistance that was obtained in 12 μsec after the bidirectional switch 1 had been turned ON.

As can be seen from FIG. 5, even when the AC power supply of 200 V is connected between the first source electrode Si and the second source electrode S2 of the bidirectional switch 1, setting the potential of the substrate 2 at a fixed potential allows the ON-state resistance ratio to be reduced compared to setting the potential of the substrate 2 at a floating potential. Therefore, the fixed potential node to which the terminal 8 of the bidirectional switch 1 is connected does not have to be a potential node where the potential becomes perfectly constant but may also be a potential node where the potential may be regarded as almost constant during the ON period of the bidirectional switch 1. The bidirectional switch 1 according to the first embodiment further includes the terminal 8 connected to the substrate 2 and used to connect the substrate 2 to a fixed potential node, thus allowing the current collapse to be reduced.

Furthermore, the fixed potential node to which the terminal 8 of the bidirectional switch 1 is connected may also be the lower-potential output terminal TA2, out of the pair of output terminals TA1, TA2 of the diode bridge DB included in the rectifier smoothing circuit. This allows the current collapse of the bidirectional switch 1 to be further reduced, compared to a situation where any of the ground of the constant voltage circuit, the higher-potential output terminal TA1 of the diode bridge DB (higher-potential output terminal of the rectifier smoothing circuit), or the cathode of the Zener diode ZD is adopted as the fixed potential node. In the constant-voltage circuit shown in FIG. 4, the resistor R13 is provided between the lower-potential output terminal TA2 of the diode bridge DB and the ground. However, the resistor R13 does not have to be provided. In a modified configuration of the constant-voltage circuit of FIG. 4 in which the resistor R13 is eliminated and in which the lower-potential output terminal TA2 of the diode bridge DB is connected to the ground, when a forward current flows through a diode D3 of the diode bridge DB, for example, the potential at the lower-potential output terminal TA2 of the diode bridge DB is clamped at the forward voltage (Vf) of the diode D3 of the diode bridge DB. In addition, according to this configuration, when a forward current flows through a diode D1 of the diode bridge DB, for example, the potential at the lower-potential output terminal TA2 of the diode bridge DB is clamped at the forward voltage (Vf) of the diode D1 of the diode bridge DB.

(1.4) Electrical Device

Next, an exemplary electrical device 300 including the bidirectional switch 1 will be described with reference to FIG. 6.

The electrical device 300 is implemented as a multi-level inverter, more specifically, a T-type three-level inverter. In this embodiment, the electrical device 300 includes: a series circuit of two switching elements Q1, Q2; a diode D1 connected antiparallel to the switching element Q1; a diode D2 connected antiparallel to the switching element Q2; and the bidirectional switch 1 connected to a node of connection between the two switching elements Q1, Q2. The two switching elements Q1, Q1 are implemented as insulated gate bipolar transistors (IGBTs).

The electrical device 300 further includes a control unit 301. The control unit 301 controls the bidirectional switch 1. When turning the bidirectional switch 1 ON, the control unit 301 controls the bidirectional switch 1 to cause a time lag (of 500 nsec, for example) between a first timing and a second timing. The first timing is a timing when a voltage equal to or higher than a threshold voltage is applied to either the first gate electrode G1 or the second gate electrode G2, which is associated with one source electrode with the lower potential selected from the first source electrode S1 and the second source electrode S2. The second timing is a timing when a voltage equal to or higher than the threshold voltage is applied to either the first gate electrode G1 or the second gate electrode G2, which is associated with the other source electrode with the higher potential selected from the first source electrode S1 and the second source electrode S2. In this embodiment, the control unit 301 controls not only the bidirectional switch 1 but also the two switching elements Q1, Q2. However, this is only an example and should not be construed as limiting. Alternatively, the control unit 301 may also be configured to control only the bidirectional switch 1.

The agent that performs the functions of the control unit 301 includes a computer system. The computer system includes a single or a plurality of computers. The computer system may include, as principal hardware components, a processor and a memory. The functions of the agent that serves as the control unit 301 according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive (magnetic disk), any of which is readable for the computer system. The processor of the computer system may be made up of a single or a plurality of electronic circuits including a semiconductor integrated circuit (IC) or a large-scale integrated circuit (LSI). Those electronic circuits may be either integrated together on a single chip or distributed on multiple chips, whichever is appropriate. Those multiple chips may be integrated together in a single device or distributed in multiple devices without limitation.

In the multi-level inverter serving as the electrical device 300, a series circuit of two capacitors C1 and C2 to form a DC power supply is connected between both terminals of the series circuit of the two switching elements Q1, Q2. The series circuit of the two capacitors C1 and C2 is connected between both terminals of a DC power supply Vd. In addition, in the multi-level inverter serving as the electrical device 300, one source electrode out of the first source electrode S1 and second source electrode S2 is connected to a node of connection between the switching elements Q1, Q2 and the other source electrode is connected to a node A2 of connection between the two capacitors C1 and C2.

Figure 6:
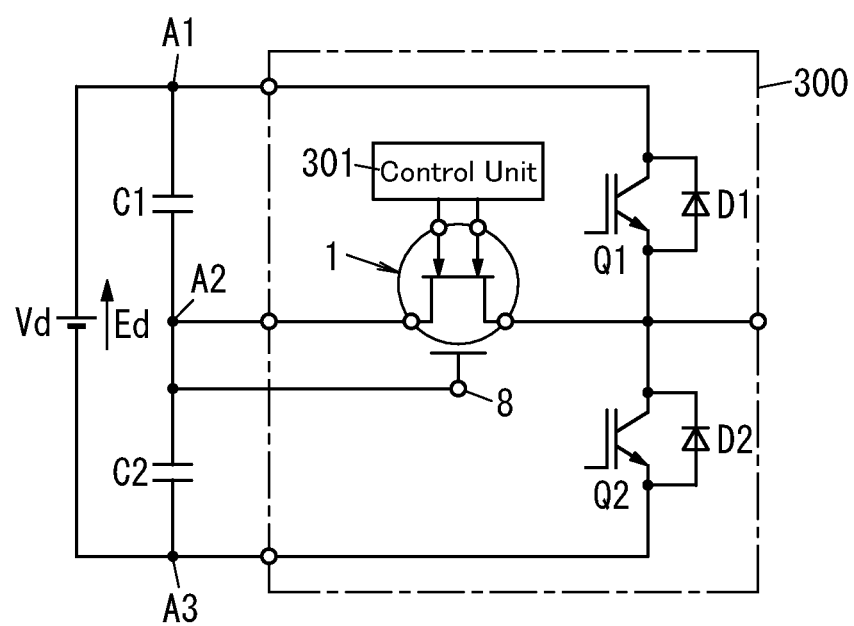
FIG. 6 is a circuit diagram of a multi-level inverter which is an electrical device including the bidirectional switch.

In FIG. 6, the terminal 8 is connected to the node A2 of connection. Alternatively, the terminal 8 may be connected to a node A1 of connection between the DC power supply Vd and the capacitor C1. Still alternatively, the terminal 8 may also be connected to a node A3 of connection between the DC power supply Vd and the capacitor C2. When the terminal 8 is connected to either the node A1 of connection or the node A2 of connection, the voltage Ed of the DC power supply Vd may be applied across one source electrode with the higher potential out of the first source electrode S1 and the second source electrode S2 and the substrate 2. On the other hand, when the terminal 8 is connected to the node A2 of connection, a voltage Ed/2 may be applied across one source electrode with the higher potential out of the first source electrode S1 and the second source electrode S2 and the substrate 2. Thus, for the multi-level inverter serving as the electrical device 300 shown in FIG. 6, the configuration in which the terminal 8 and the node A2 of connection are connected and which contributes to lowering the maximum voltage applied to the bidirectional switch 1 is preferred.

The basic operation of the multi-level inverter is described, for example, in WO 2013/099053 A1, and description thereof will be omitted herein.

Note that the first embodiment described above is only an exemplary one of various embodiments of the present disclosure and should not be construed as limiting. Rather, the first embodiment described above may be readily modified in various manners depending on a design choice or any other factor without departing from the scope of the present disclosure.

For example, the bidirectional switch element 10 may include one or more nitride semiconductor layers between the buffer layer 3 and the GaN layer 4. Also, the buffer layer 3 does not have to have a single-layer structure but may also have a superlattice structure, for example.

Furthermore, as long as the substrate 2 has electrical conductivity, the substrate 2 does not have to be a silicon substrate but may also be a GaN substrate or an SiC substrate, for example.

Note that the package 11 is not an essential constituent element for the bidirectional switch 1. Rather, as long as the bidirectional switch 1 includes the terminal 8 connected to the substrate 2 and used to connect the substrate 2 to a fixed potential node during an ON period of the bidirectional switch 1, the bidirectional switch 1 may include none of the constituent elements of the package 11 but the terminal 8. Also, even when the bidirectional switch 1 includes the package 11, the bidirectional switch 1 only needs to include the terminal 8 and the shapes of the terminal 8 and the package 11 are not limited to any particular ones.

Furthermore, in the embodiment described above, the terminal 8 is formed integrally with the conductive die pad 7. However, this is only an example and should not be construed as limiting. Alternatively, the terminal 8 may also be configured as a conductive layer provided on the second principal surface 22 of the substrate 2 and making ohmic contact with the substrate 2. Note that when the terminal 8 is formed integrally with the conductive die pad 7, the terminal 8 and the conductive die pad 7 may be formed out of a lead frame, for example.

The electrical device including the bidirectional switch 1 does not have to be implemented as the multi-level inverter, but may also be implemented as a dimmer, a matrix converter for performing AC-AC power conversion, or any other type of electrical device.

A power conversion device including a circuit in which two bidirectional switch circuits (bidirectional switches) are connected in parallel (i.e., a bidirectional switch device) is proposed by Document 1 (JP 2017-011926 A). Each of the bidirectional switch circuits is made up of semiconductor switching elements.

Document 1 discloses, as two exemplary bidirectional switch circuits, a configuration including two IGBTs and two diodes and a configuration including two MOSFETs and two diodes.

In a bidirectional switch device formed by connecting a plurality of bidirectional switches in parallel, if a current is concentrated on only one of the plurality of bidirectional switches, then the temperature of the bidirectional switch device tends to increase so easily that the bidirectional switch device could be damaged by heat. When damaged by heat, the bidirectional switch device may have its electrical characteristics affected (deteriorated) or may cause cracks, for example.

The second through eighth embodiments to be described below may provide an electrical device (switch system) which is hardly damaged by heat for the bidirectional switch device and a method for controlling the bidirectional switch device.

Second Embodiment

An electrical device 300a according to a second embodiment will be described with reference to FIGS. 7, 8, 9A, and 9B. The electrical device 300a is implemented as a switch system.

(2.1) Overall Configuration for Electrical Device

The electrical device 300a includes a bidirectional switch device 101 and a control system 302 for controlling the bidirectional switch device 101.

Figure 7:
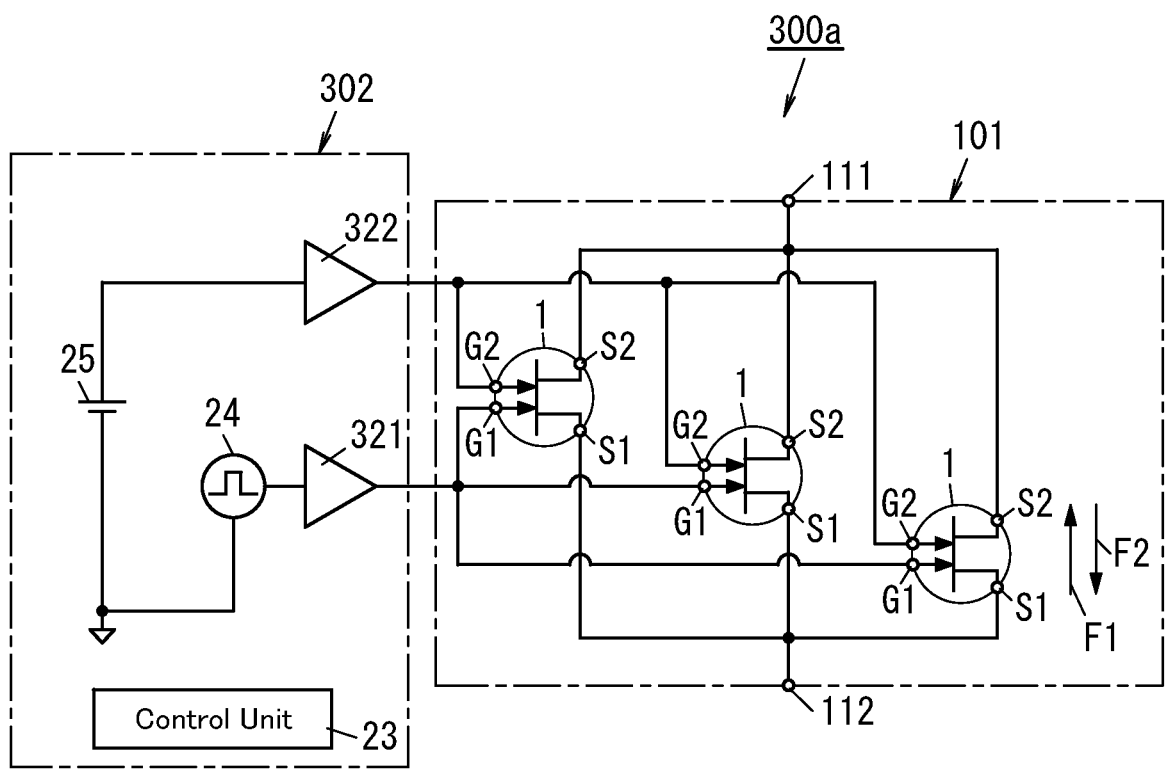
FIG. 7 is a circuit diagram of a switch system according to a second embodiment.

As shown in FIG. 7, the bidirectional switch device 101 is formed by connecting a plurality of (e.g., three) bidirectional switches 1 in parallel. In this embodiment, the bidirectional switch device 101 includes a pair of main terminals 111, 112 and also includes a parallel circuit of the plurality of bidirectional switches 1 between the pair of main terminals 111, 112. The bidirectional switches 1 have the same configuration as the bidirectional switch 1 according to the first embodiment, and description thereof will be omitted herein as appropriate. In FIG. 7, the terminal 8 shown in FIG. 6 is not shown.

In FIG. 8, the terminal 8 and the package body 110 shown as an example in FIG. 1 are not shown. In the bidirectional switch device 101, the plurality of bidirectional switches 1 may be housed in a single package.

Each of the plurality of bidirectional switches 1 includes the first gate electrode G1 and the second gate electrode G2.

Each of the plurality of bidirectional switches 1 is switchable from one of a bidirectional ON state, a bidirectional OFF state, a first diode state, or a second diode state to another. The bidirectional ON state is a state where currents are allowed to flow bidirectionally (namely, in a first direction F1 and in a second direction F2 opposite from the first direction F1). The bidirectional OFF state is a state where the bidirectional currents are cut off. The first diode state is a state where a current is allowed to flow in the first direction F1. The second diode state is a state where a current is allowed to flow in the second direction F2.

(2.2) Constituent Elements of Electrical Device (Switch System)

(2.2.1) Bidirectional Switch Device (2.2.1.1) Configuration for Bidirectional Switch Device As shown in FIG. 8, for example, the bidirectional switch 1 includes: a substrate 2; a GaN layer 4 serving as a first nitride semiconductor layer; an AlGaN layer 5 serving as a second nitride semiconductor layer; a first source electrode S1; a first gate electrode G1; a second gate electrode G2; a second source electrode S2; a first p-type $Al_{x1}Ga_{1-x1}N$ layer 61 serving as a first p-type layer; and a second p-type $Al_{x2}Ga_{1-x2}N$ layer 62 serving as a second p-type layer.

The bidirectional switch 1 includes a first gate 81 and a second gate 82. The first gate 81 of the bidirectional switch 1 includes: a first gate electrode G1; and a first p-type $Al_{x1}Ga_{1-x1}N$ layer 61 which forms, along with the AlGaN layer 5, a first diode structure 91. The second gate 82 includes: a second gate electrode G2; and a second p-type $Al_{x2}Ga_{1-x2}N$ layer 62 which forms, along with the AlGaN layer 5, a second diode structure 92. Therefore, the bidirectional switch 1 shown in FIG. 8 is not an insulated gate field effect transistor (FET) such as a metal-oxide semiconductor field effect transistor (MOSFET) but a junction-gate FET. In this embodiment, the bidirectional switch 1 is implemented as a dual-gate GaN-based GIT.

The second nitride semiconductor layer has a larger bandgap than the first nitride semiconductor layer.

(2.2.1.2) Operation of Bidirectional Switch in Bidirectional Switch Device

In the following description, a state where a voltage equal to or higher than a first threshold voltage (of 1.3 V, for example) is not applied across the first gate electrode G1 and the first source electrode S1 will be hereinafter referred to, for the sake of convenience, as a state where the first gate 81 is OFF. On the other hand, a state where a voltage equal to or higher than the first threshold voltage is applied across the first gate electrode G1 and the first source electrode S1 with the first gate electrode G1 having the higher potential will be hereinafter referred to as a state where the first gate 81 is ON. Also, a state where a voltage equal to or higher than a second threshold voltage (of 1.3 V, for example) is not applied across the second gate electrode G2 and the second source electrode S2 will be hereinafter referred to as a state where the second gate 82 is OFF. On the other hand, a state where a voltage equal to or higher than the second threshold voltage is applied across the second gate electrode G2 and the second source electrode S2 with the second gate electrode G2 having the higher potential will be hereinafter referred to as a state where the second gate 82 is ON.

This bidirectional switch 1 includes the first p-type $Al_{x1}Ga_{1-x1}N$ layer 61 (first p-type layer) and the second p-type $Al_{x2}Ga_{1-x2}N$ layer 62 (second p-type), thereby operating as a normally OFF transistor. In this case, when the first gate 81 is OFF, the first p-type $Al_{x1}Ga_{1-x1}N$ layer 61 forms a depletion layer right under the first p-type $Al_{x1}Ga_{1-x1}N$ layer 61 such that the depletion layer runs through the AlGaN layer 5 (second nitride semiconductor layer) to reach the GaN layer 4 (first nitride semiconductor layer). When the second gate 82 is OFF, the second p-type $Al_{x2}Ga_{1-x2}N$ layer 62 (second p-type layer) forms a depletion layer right under the second p-type $Al_{x2}Ga_{1-x2}N$ layer 62 such that the depletion layer runs through the AlGaN layer 5 to reach the GaN layer 4. In the state where the first gate 81 is ON, the bidirectional switch 1 may connect the first gate electrode G1 and the first source electrode S1 with the two-dimensional electron gas layer.

In other words, when the first gate 81 is ON, the bidirectional switch 1 may prevent the depletion layer from shutting off the two-dimensional electron gas layer between the first gate electrode G1 and the first source electrode S1. In addition, in the state where the second gate 82 is ON, the bidirectional switch 1 may connect the second gate electrode G2 and the second source electrode S2 with the two-dimensional electron gas layer. In other words, when the second gate 82 is ON, the bidirectional switch 1 may prevent the depletion layer from shutting off the two-dimensional electron gas layer between the second gate electrode G2 and the second source electrode S2.

The bidirectional switch 1 is switchable from one of a bidirectional ON state, a bidirectional OFF state, a first diode state, or a second diode state to another, according to a combination of a first gate voltage Vg1 (see FIG. 9A) and a second gate voltage Vg2 (see FIG. 9A) applied to the first gate 81 and the second gate 82, respectively. The first gate voltage Vg1 is a voltage applied across the first gate 81 and a first source 71 including the first source electrode S1 in the bidirectional switch 1. In this case, the first gate voltage Vg1 is a voltage applied from the control system 302 across the first gate electrode G1 and first source electrode S1 of the bidirectional switch 1. The second gate voltage Vg2 is a voltage applied across the second gate 82 and a second source 72 including the second source electrode S2 in the bidirectional switch 1. In this case, the second gate voltage Vg2 is a voltage applied from the control system 302 across the second gate electrode G2 and second source electrode S2 of the bidirectional switch 1.

(2.2.1.2.1) Bidirectional ON State

In a state where the first gate 81 is ON and the second gate 82 is ON, the bidirectional switch 1 switches to the bidirectional ON state. The bidirectional ON state is a state in which a current is allowed to flow bidirectionally between the first source electrode S1 and the second source electrode S2. More specifically, in the bidirectional ON state, a current may flow from the first source electrode S1 toward the second source electrode S2 when the first source electrode S1 has a higher potential than the second source electrode S2 and a current may flow from the second source electrode S2 toward the first source electrode S1 when the second source electrode S2 has a higher potential than the first source electrode S1.

Figure 9A:
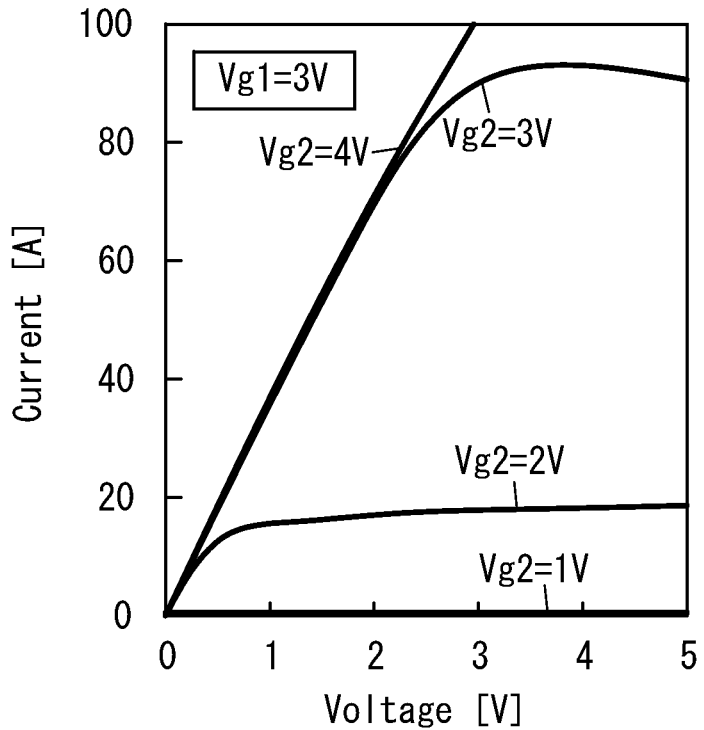
FIG. 9A shows current-voltage characteristics in an FET mode of a bidirectional switch included in the bidirectional switch device of the switch system.

The bidirectional ON state of the bidirectional switch 1 is an FET mode as the operation mode of the bidirectional switch 1. FIG. 9A shows exemplary current-voltage characteristics in the FET mode of the bidirectional switch 1. The current-voltage characteristics shown in FIG. 9A are obtained in a situation where the first gate voltage Vg1 applied to the first gate 81 is 3 V and the second gate voltage Vg2 applied to the second gate 82 has varied. In FIG. 9A, the abscissa indicates the voltage between the second source electrode S2 and the first source electrode S1 and the ordinate indicates a current flowing from the second source electrode S2 toward the first source electrode S1. That is to say, the ordinate in FIG. 9A indicates a current flowing in the second direction F2. As can be seen from FIG. 9A, when operating in the FET mode, the bidirectional switch 1 has the same ON-state resistance, irrespective of the value of the second gate voltage Vg2. It can also be seen from FIG. 9A that when the bidirectional switch 1 operates in the FET mode, the higher the second gate voltage Vg2 is, the larger the amount of the saturated current is.

(2.2.1.2.2) Bidirectional OFF State

In a state where the first gate 81 is OFF and the second gate 82 is OFF, the bidirectional switch 1 switches to the bidirectional OFF state. In the bidirectional OFF state, bidirectional currents may be cut off in any direction between the first source electrode S1 and the second source electrode S2. More specifically, in the bidirectional OFF state, a current flowing from the first source electrode S1 toward the second source electrode S2 is cut off when the first source electrode S1 has a higher potential than the second source electrode S2 and a current flowing from the second source electrode S2 toward the first source electrode S1 is also cut off when the second source electrode S2 has a higher potential than the first source electrode S1.

(2.2.1.2.3) First Diode State

In a state where the first gate 81 is OFF and the second gate 82 is ON, the bidirectional switch 1 switches to the first diode state. More specifically, in the first diode state, between the second source electrode S2 and the first source electrode S1, a current is allowed to flow in the first direction F1 from the first source electrode S1 toward the second source electrode S2 and a current may be cut off in the second direction F2 from the second source electrode S2 toward the first source electrode S1. More specifically, in the first diode state, when the first source electrode S1 has a potential higher by at least the first threshold voltage than the second source electrode S2, a current flows from the first source electrode S1 toward the second source electrode S2. On the other hand, when the second source electrode S2 has a higher potential than the first source electrode S1, a current flowing from the second source electrode S2 toward the first source electrode S1 is cut off.

Figure 9B:
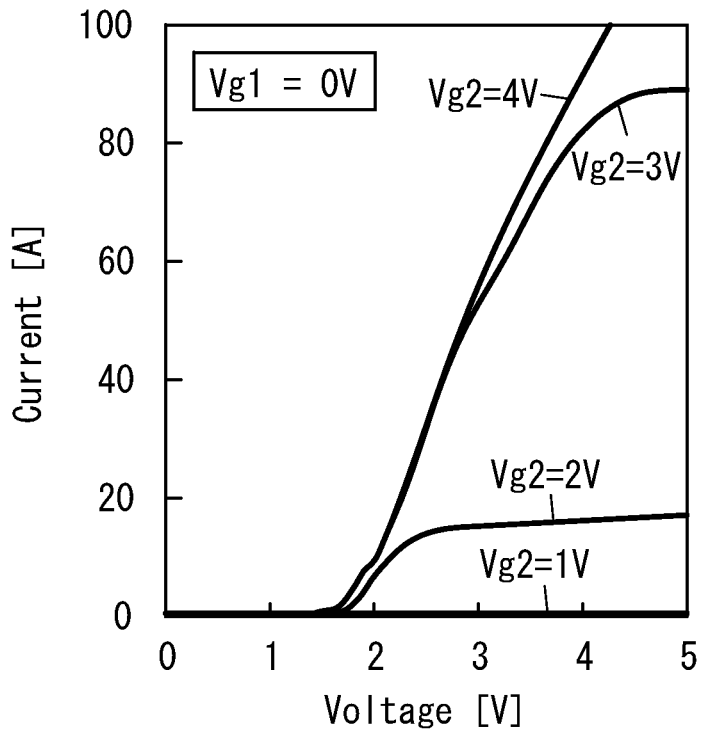
FIG. 9B shows current-voltage characteristics in a diode mode of the bidirectional switch included in the bidirectional switch device of the switch system.

The first diode state of the bidirectional switch 1 is a diode mode as the operation mode of the bidirectional switch 1. FIG. 9B shows exemplary current-voltage characteristics in the diode mode of the bidirectional switch 1. The current-voltage characteristics shown in FIG. 9B are obtained in a situation where the first gate voltage Vg1 is 0 V (i.e., when the first gate 81 is OFF) and the second gate voltage Vg2 applied to the second gate 82 has varied. In FIG. 9B, the abscissa indicates the voltage between the first source electrode S1 and the second source electrode S2 and the ordinate indicates a current flowing from the first source electrode S1 toward the second source electrode S2.

As can be seen from FIG. 9B, when the bidirectional switch 1 is operating in the first diode state (i.e., in the diode mode), the higher the second gate voltage Vg2 is, the larger the amount of the saturated current is. That is to say, when operating in the first diode state, the bidirectional switch 1 may regulate a saturated current by varying the second gate voltage Vg2 while setting the first gate voltage Vg1 at 0 V.

(2.2.1.2.4) Second Diode State

In a state where the first gate 81 is ON and the second gate 82 is OFF, the bidirectional switch 1 switches to the second diode state. More specifically, in the second diode state, between the second source electrode S2 and the first source electrode S1, a current is allowed to flow in the second direction F2 from the second source electrode S2 toward the first source electrode S1 and a current may be cut off in the first direction F1 from the first source electrode S1 toward the second source electrode S2. More specifically, in the second diode state, when the first source electrode S1 has a higher potential than the second source electrode S2, a current flowing from the first source electrode S1 toward the second source electrode S2 is cut off. On the other hand, when the second source electrode S2 has a potential higher by at least the second threshold voltage than the first source electrode S1, a current flows from the second source electrode S2 toward the first source electrode S1.

In the bidirectional switch 1, the first threshold voltage and the second threshold voltage have the same value. However, this is only an example and should not be construed as limiting. Alternatively, the first threshold voltage and the second threshold voltage may have mutually different values. The first threshold voltage is a threshold voltage that causes a depletion layer, expanding under the first gate electrode G1 to shut off the two-dimensional electron gas layer to shrink to the degree of allowing a current to flow through the two-dimensional electron gas layer. The second threshold voltage is a threshold voltage that causes a depletion layer, expanding under the second gate electrode G2 to shut off the two-dimensional electron gas layer to shrink to the degree of allowing a current to flow through the two-dimensional electron gas layer.

(2.2.2) Control System

As shown in FIG. 7, the control system 302 includes a first gate driver circuit 321 and a second gate driver circuit 322. The control system 302 further includes a control unit 23.

The first gate driver circuit 321 is connected to (the respective first gate electrodes G1 of) the first gates 81 of the plurality of bidirectional switches 1. The first gate driver circuit 321 is supplied with DC voltage from a first power supply 24. The first power supply 24 may be a pulse power supply, for example. However, this is only an example and should not be construed as limiting. Alternatively, the first power supply 24 may also be a DC voltage source for supplying a constant voltage.

The first gate driver circuit 321 is a circuit for applying the first gate voltage Vg1 to the respective first gates 81 of the plurality of bidirectional switches 1. The first gate driver circuit 321 includes a first gate driver. In the first gate driver circuit 321, the magnitude of the first gate voltage Vg1 varies according to the magnitude of the supply voltage of the first gate driver. The first gate driver of the first gate driver circuit 321 is controlled in accordance with a control signal supplied from the control unit 23, for example.

The second gate driver circuit 322 is connected to (the respective second gate electrodes G2 of) the second gates 82 of the plurality of bidirectional switches 1. The second gate driver circuit 322 is supplied with DC voltage from a second power supply 25. The second power supply 25 may be a DC voltage source, for example.

The second gate driver circuit 322 is a circuit for applying the second gate voltage Vg2 to the respective second gates 82 of the plurality of bidirectional switches 1. The second gate driver circuit 322 includes a second gate driver. In the second gate driver circuit 322, the magnitude of the second gate voltage Vg2 varies according to the magnitude of the supply voltage of the second gate driver. The second gate driver circuit 322 may be controlled in accordance with a control signal supplied from the control unit 23, for example.

In the control system 302, the first gate driver circuit 321 and the second gate driver circuit 322 have mutually different output voltages. For example, in the control system 302, the first gate driver circuit 321 has an output voltage of 3.0 V and the second gate driver circuit 322 has an output voltage of 2.0 V.

The agent that performs the functions of the control unit 23 includes a computer system. The computer system includes a single or a plurality of computers. The computer system may include, as principal hardware components, a processor and a memory. The functions of the agent serving as the control unit 23 according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive (magnetic disk), any of which is readable for the computer system. The processor of the computer system may be made up of a single or a plurality of electronic circuits including a semiconductor integrated circuit (IC) or a large-scale integrated circuit (LSI). Those electronic circuits may be either integrated together on a single chip or distributed on multiple chips, whichever is appropriate. Those multiple chips may be integrated together in a single device or distributed in multiple devices without limitation.

(2.3) Operation of Switch System

The control system 302 applies the first gate voltage Vg1 and the second gate voltage Vg2 to the first gate 81 and the second gate 82 of each of the plurality of bidirectional switches 1 such that when each of the plurality of bidirectional switches 1 is in either the first diode state or the second diode state, the saturated current Isat (see FIG. 10) has its value reduced to less than the magnitude Iin (see FIG. 10) of an input current supplied to the bidirectional switch device 101. If the magnitude Iin of the input current is 100 A and the rated current of each of the plurality of bidirectional switches 1 is less than 100 A (e.g., 50 A), the saturated current Isat of each of the plurality of bidirectional switches 1 in either the first diode state or the second diode state is supposed to fall within the range from 35 A to 40 A, for example. In this case, the saturated current Isat is determined to be greater than the value obtained by dividing the magnitude Iin of the input current by the number of the bidirectional switches 1 in the bidirectional switch device 101 but less than the rated current. In the electrical device 300a serving as a switch system, when each of the plurality of bidirectional switches 1 is in either the first diode state or the second diode state, the current flowing through each of the three bidirectional switches 1 does not have to be saturated. For example, the magnitude of the current flowing through two out of the three bidirectional switches 1 may be equal to the saturated current Isat while the magnitude of the current flowing through the other bidirectional switch 1 may be less than the saturated current Isat. That is to say, the current flowing through the other bidirectional switch 1 does not have to be saturated.

Figure 10:
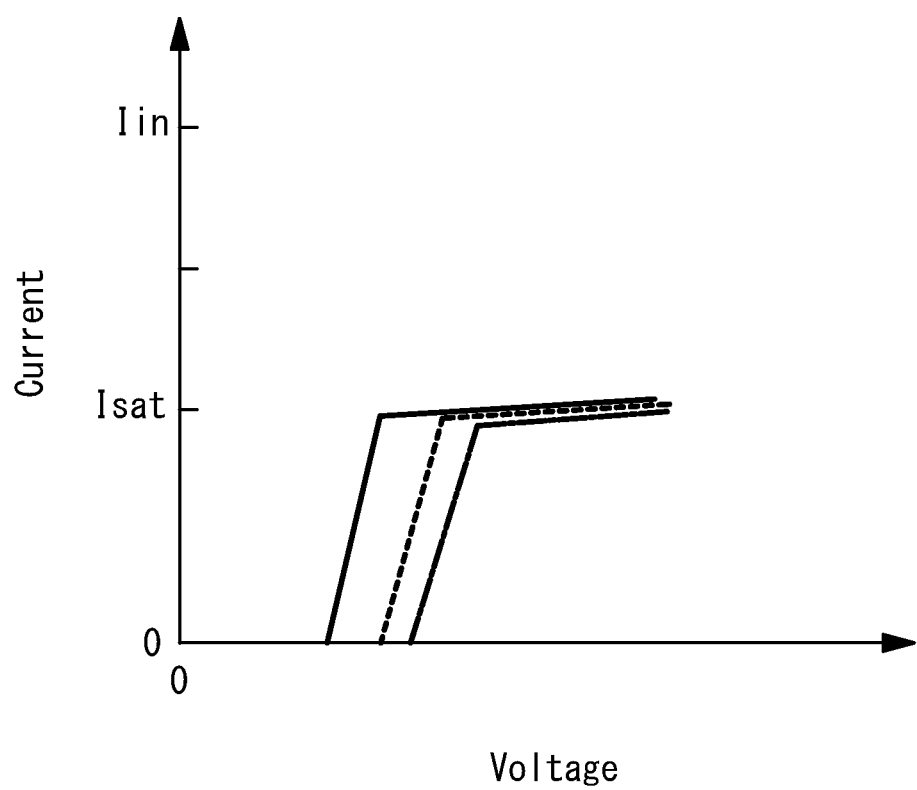
FIG. 10 is a graph showing how the switch system may operate.

FIG. 10 shows current-voltage characteristics when each of the three bidirectional switches 1 of the bidirectional switch device 101 operates in a diode mode. The forward voltage (Vf) representing a characteristic of each bidirectional switch 1 in the diode mode may be about 3.4 V, for example. However, the forward voltage may vary among the plurality of bidirectional switches 1 due to some dispersion involved with the manufacturing process. In this case, FIG. 10 schematically shows the current-voltage characteristics in such a situation where the forward voltage varies among the three bidirectional switches 1 operating in the diode mode. In FIG. 10, the abscissa indicates the voltage applied across the pair of main terminals 111, 112 of the bidirectional switch device 101 and the ordinate indicates a current flowing through the bidirectional switch 1. In the following description, the three bidirectional switches 1 will be hereinafter referred to as first, second, and third bidirectional switches 1, respectively, in the ascending order of their forward voltage for the sake of convenience.

In the electrical device 300a, if the first to third bidirectional switches 1 operate in the diode mode, a current flows through the first bidirectional switch 1 first. Then, when the current flowing through the first bidirectional switch 1 becomes equal to the saturated current Isat, the voltage rises in the first bidirectional switch 1 and a current also starts to flow through the second bidirectional switch 1. Thereafter, when the current flowing through the second bidirectional switch 1 becomes equal to the saturated current Isat, the voltage rises in the second bidirectional switch 1 and a current also starts to flow through the third bidirectional switch 1. This causes the same amount of current as the magnitude Iin of the input current to flow through the bidirectional switch device 101 without allowing a current equal to or greater than the rated current to flow through any of the plurality of bidirectional switches 1 in the electrical device 300a.

(2.4) Method for Controlling Bidirectional Switch Device

A method for controlling the bidirectional switch device 101 includes applying the first gate voltage Vg1 and the second gate voltage Vg2 to the first gate 81 and the second gate 82, respectively, in each of the plurality of bidirectional switches 1 such that when each of the plurality of bidirectional switches 1 is in either the first diode state or the second diode state, the saturated current Isat has its value reduced to less than the magnitude Iin of an input current supplied to the bidirectional switch device 101.

(2.5) Advantage

In the electrical device 300a according to the second embodiment, the control system 302 applies the first gate voltage Vg1 and the second gate voltage Vg2 to the first gate 81 and the second gate 82, respectively, in each of the plurality of bidirectional switches 1 such that when each of the plurality of bidirectional switches 1 is in either the first diode state or the second diode state, the saturated current Isat has its value reduced to less than the magnitude Iin of an input current supplied to the bidirectional switch device 101. This reduces the chances of the bidirectional switch device 101 being damaged by heat in the electrical device 300a according to the second embodiment.

(2.6) Applications of Electrical Device

Figure 11:
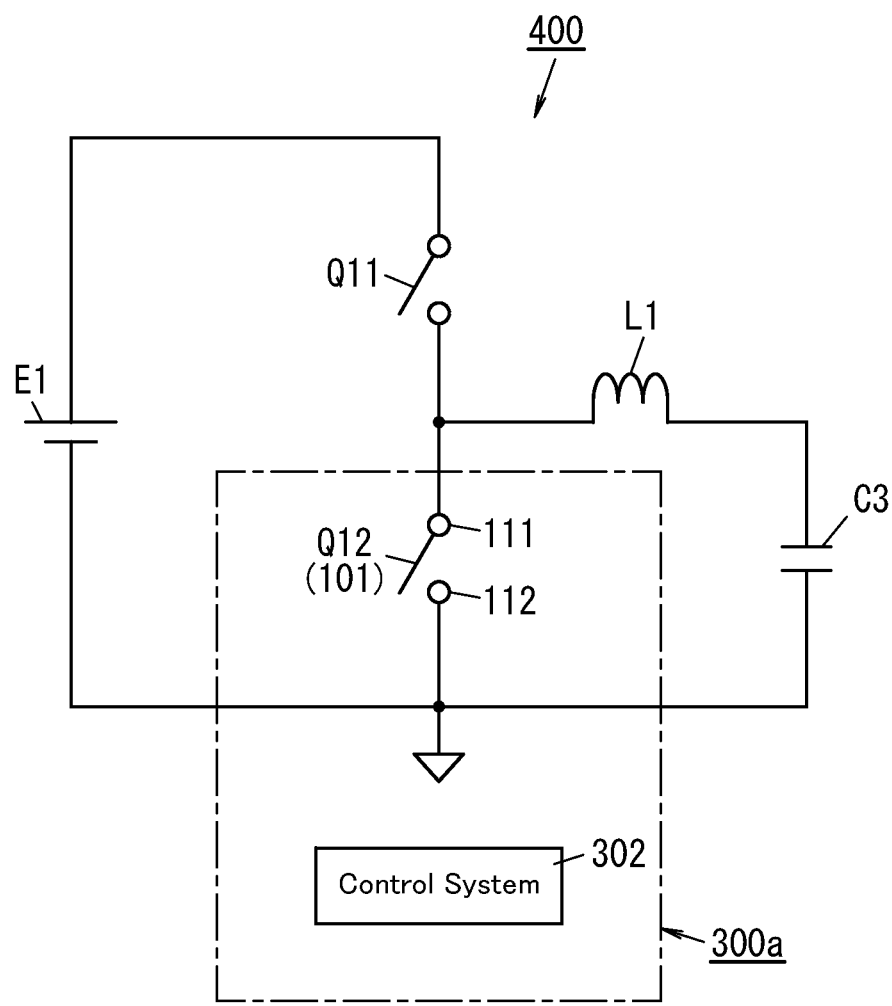
FIG. 11 is a circuit diagram of a voltage step-down DC-DC converter to which the switch system is applied.

The electrical device 300a is applicable to, for example, a voltage step-down DC-DC converter 400 such as the one shown in FIG. 11.

The voltage step-down DC-DC converter 400 shown in FIG. 11 includes: a series circuit of a high-side switch Q11 and a low-side switch Q12, which is connected between both terminals of a DC power supply E1; and a series circuit of an inductor L1 and a capacitor C3, which is connected between the ground and a node of connection between the high-side switch Q11 and the low-side switch Q12. When the electrical device 300a is implemented as the voltage step-down DC-DC converter 400 shown in FIG. 11, the bidirectional switch device 101 is applied as the low-side switch Q12. The high-side switch Q11 may be an FET (such as a GaN-based FET). In that case, the electrical device 300a further includes a high-side gate driver circuit for applying a gate voltage Vgh (see FIG. 12) to the high-side switch Q11 to control the low-side switch Q12 and the high-side switch Q11.

Figure 12:
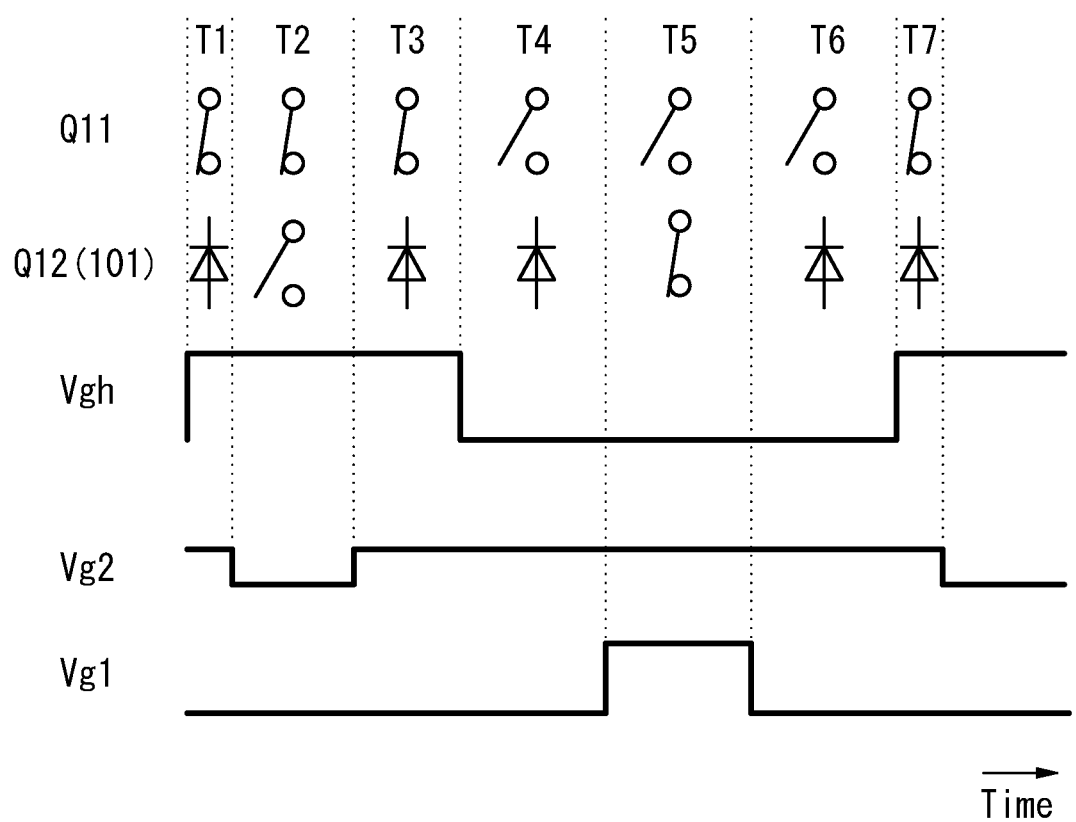
FIG. 12 shows how the switch system may operate when applied to the voltage step-down DC-DC converter.

The control unit 23 (see FIG. 7) makes the high-side switch Q11 and the low-side switch Q12 operate in accordance with the sequence shown in FIG. 12. In FIG. 12, the respective operating states of the high-side switch Q11 and low-side switch Q12 in a plurality of periods T1-T7 are schematically indicated by symbols each representing either a switch or a diode. Specifically, in the period T1, the operating state of the high-side switch Q11 is ON state and the operating state of the low-side switch Q12 is the first diode state. In the period T2, the operating state of the high-side switch QI is ON state and the operating state of the low-side switch Q12 is the bidirectional OFF state. In the period T3, the operating state of the high-side switch Q11 is ON state and the operating state of the low-side switch Q12 is the first diode state. In the period T4, the operating state of the high-side switch Q11 is OFF state and the operating state of the low-side switch Q12 is the first diode state. In the period T5, the operating state of the high-side switch Q11 is OFF state and the operating state of the low-side switch Q12 is the bidirectional ON state. In the period T6, the operating state of the high-side switch Q11 is OFF state and the operating state of the low-side switch Q12 is the first diode state. In the period T7, the operating state of the high-side switch Q11 is ON state and the operating state of the low-side switch Q12 is the first diode state. In the period T2, the operating state of the low-side switch Q12 is the bidirectional OFF state. However, this is only an example and should not be construed as limiting. Alternatively, the operating state of the low-side switch Q12 in the period T2 may also be the first diode state. In the period T5, the operating state of the low-side switch Q12 is the bidirectional ON state. However, this is only an example and should not be construed as limiting. Alternatively, the operating state of the low-side switch Q12 in the period T5 may also be the first diode state.

Figure 13:
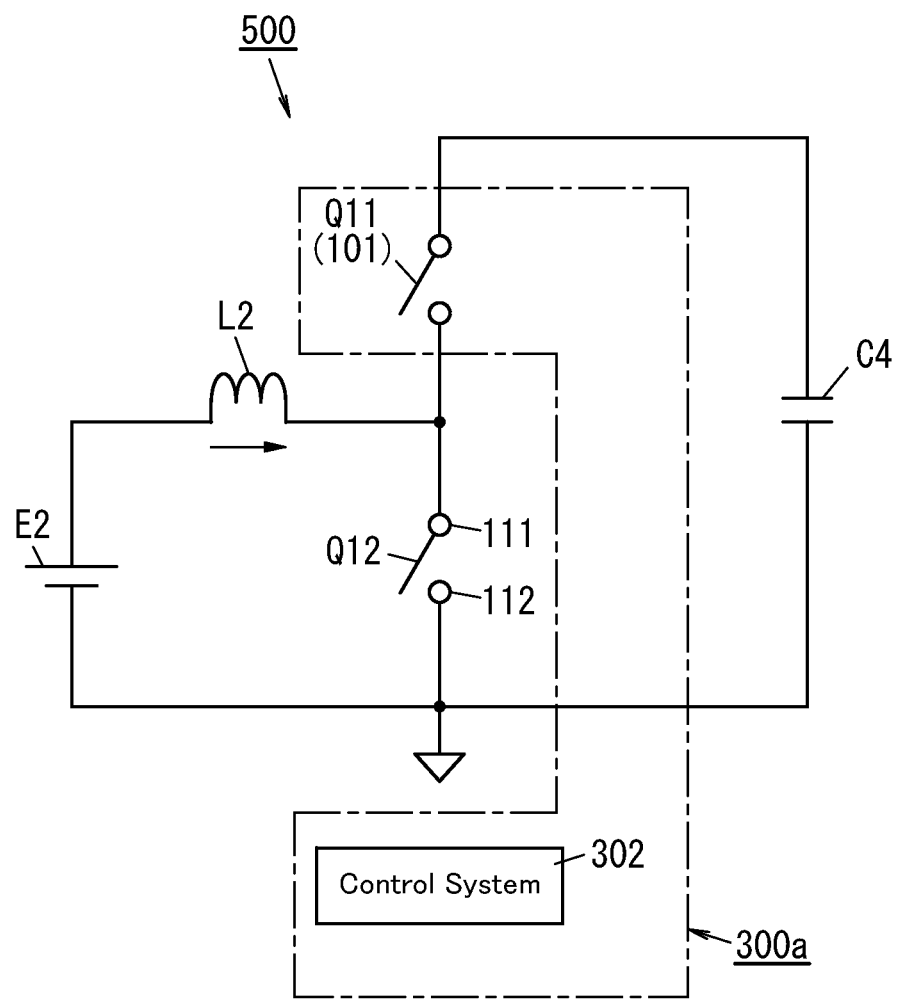
FIG. 13 is a circuit diagram of a voltage step-up DC-DC converter to which the switch system is applied.

The electrical device 300a does not have to be applied to the voltage step-down DC-DC converter 400 but may also be applied to a voltage step-up DC-DC converter 500 such as the one shown in FIG. 13. The voltage step-up DC-DC converter 500 shown in FIG. 13 includes a series circuit of the high-side switch Q11 and the low-side switch Q12, a capacitor C4, and an inductor L2. The capacitor C4 is connected between both terminals of the series circuit of the high-side switch Q11 and the low-side switch Q12. The inductor L2 is connected to a node of connection between the high-side switch Q11 and the low-side switch Q12. In the voltage step-up DC-DC converter 500, a DC power supply E2 is connected between both terminals of a series circuit of the inductor L2 and the low-side switch Q12. When the electrical device 300a is implemented as the voltage step-up DC-DC converter 500 shown in FIG. 13, the bidirectional switch device 101 is applied as the high-side switch Q11. The low-side switch Q12 may be an FET (such as a GaN-based FET). In that case, the electrical device 300a further includes a low-side gate driver circuit for applying a gate voltage to the low-side switch Q12 to control the high-side switch QI and the low-side switch Q12.

Third Embodiment

Figure 14:
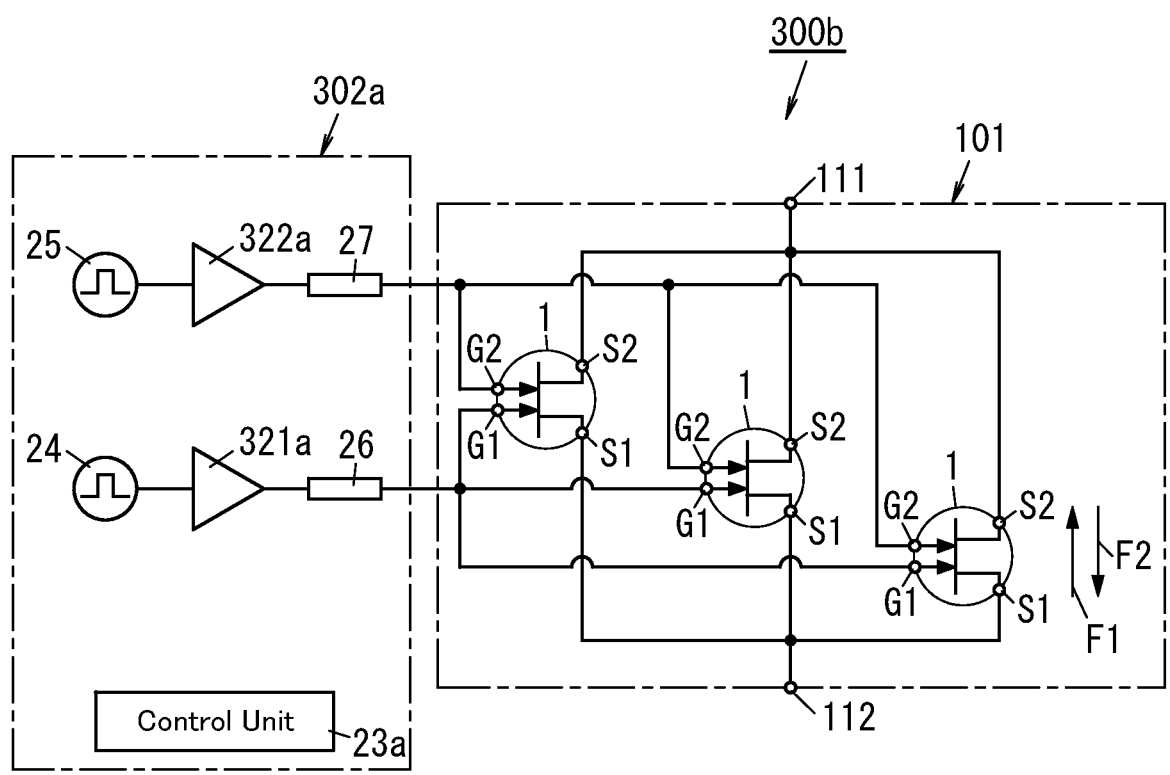
FIG. 14 is a circuit diagram of a switch system according to a third embodiment.

Next, an electrical device 300b according to a third embodiment will be described with reference to FIG. 14. The electrical device 300b is implemented as a switch system.

The electrical device 300b according to the third embodiment is almost the same as the electrical device 300a according to the second embodiment except that the electrical device 300b according to the third embodiment includes a control system 302a instead of the control system 302, which is a major difference from the electrical device 300a according to the second embodiment. In the following description, any constituent element of the electrical device 300b according to this third embodiment, having the same function as a counterpart of the electrical device 300a according to the second embodiment described above, will be designated by the same reference numeral as that counterpart's, and description thereof will be omitted herein. The bidirectional switch 1 has the same configuration as the bidirectional switch 1 according to the first embodiment and description thereof will be omitted herein as appropriate. In FIG. 14, illustration of the terminal 8 shown in FIG. 6 is omitted.

The control system 302a, as well as the control system 302, also applies the first gate voltage Vg1 and the second gate voltage Vg2 to the first gate 81 and the second gate 82, respectively, in each of the plurality of bidirectional switches 1 such that when each of the plurality of bidirectional switches 1 is in either the first diode state or the second diode state, the saturated current Isat has its value reduced to less than the magnitude Iin of an input current supplied to the bidirectional switch device 101.

The control system 302a includes a first gate driver circuit 321a, a second gate driver circuit 322a, a first gate resistor 26, and a second gate resistor 27. In addition, the control system 302a includes a control unit 23a instead of the control unit 23 of the control system 302.

In the control system 302a, the first gate driver circuit 321a and the second gate driver circuit 322a have the same circuit configuration. The output voltage of the first gate driver circuit 321a is as high as the output voltage of the second gate driver circuit 322a. The output voltage of each of the first gate driver circuit 321a and the second gate driver circuit 322a may be 12 V, for example. The first gate driver circuit 321a is supplied with a DC voltage from the first power supply 24. The first power supply 24 may be a pulse power supply, for example. However, this is only an example and should not be construed as limiting. The first power supply 24 may also be a DC voltage source that supplies a constant voltage. The second gate driver circuit 322a is supplied with a DC voltage from the second power supply 25. The second power supply 25 may be a pulse power supply, for example. However, this is only an example and should not be construed as limiting. The second power supply 25 may also be a DC voltage source that supplies a constant voltage. In the control system 302a, the first power supply 24 and the second power supply 25 are the same power supply. The first gate driver circuit 321a, the second gate driver circuit 322a, the first power supply 24, and the second power supply 25 are controlled in accordance with a control signal from the control unit 23a. In the control system 302a, the control unit 23a is not an essential constituent element.

One terminal of the first gate resistor 26 is connected to the output terminal of the first gate driver circuit 321a. The other terminal of the first gate resistor 26 is connected to the first gate electrode G1 of the first gate in each of the plurality of bidirectional switches 1. One terminal of the second gate resistor 27 is connected to the output terminal of the second gate driver circuit 322a. The other terminal of the second gate resistor 27 is connected to the second gate electrode G2 of the second gate in each of the plurality of bidirectional switches 1. The resistance value of the first gate resistor 26 and the resistance value of the second gate resistor 27 are different from each other. In this example, the resistance value of the first gate resistor 26 is smaller than the resistance value of the second gate resistor 27.

Figure 15:
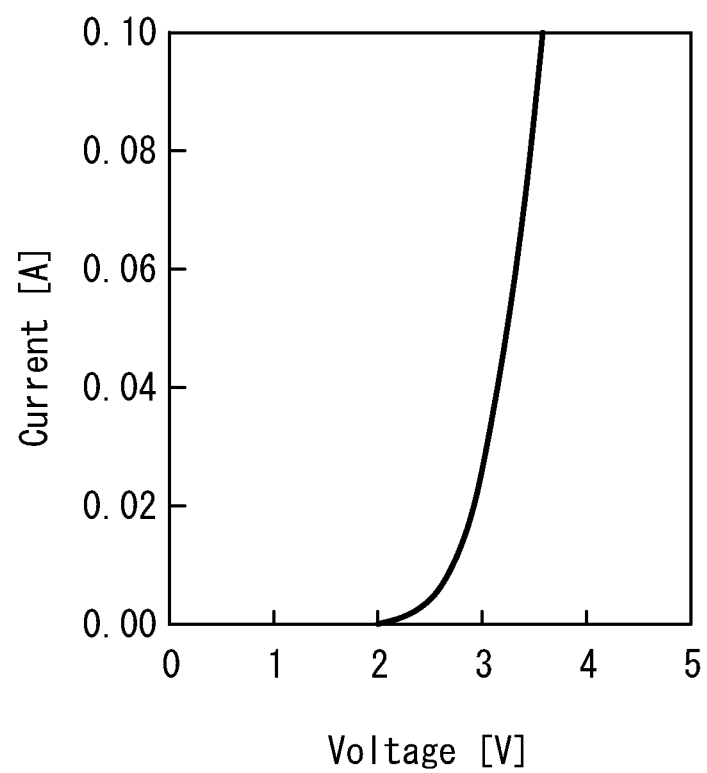
FIG. 15 shows current-voltage characteristics of a bidirectional switch included in the bidirectional switch device of the switch system.

FIG. 15 shows an exemplary voltage-current characteristic of the first gate 81 of the bidirectional switch 1. In FIG. 15, the abscissa indicates the first gate voltage Vg1 of the first gate 81 and the ordinate indicates a current flowing from the first gate 81 toward the first source electrode S1. That is to say, the ordinate indicates the current flowing through the first diode structure 91. As can be seen from FIG. 15, the bidirectional switch 1 may change the first gate voltage Vg1 applied to the first gate 81 by varying the current flowing toward the first gate 81. In the control system 302a, the current flowing toward the first gate 81 may be determined based on the supply voltage of the first gate driver included in the first gate driver circuit 321a and the resistance value of the first gate resistor 26. Likewise, the bidirectional switch 1 may also change the second gate voltage Vg2 applied to the second gate 82 by varying the current flowing toward the second gate 82. In the control system 302a, the current flowing toward the second gate 82 may be determined based on the supply voltage of the second gate driver included in the second gate driver circuit 322a and the resistance value of the second gate resistor 27.

In the control system 302a, the first gate resistor 26 is provided between the first gate driver circuit 321a and the first gate electrode G1 of the first gate 81 in each of the plurality of bidirectional switches 1 and the second gate resistor 27 is provided between the second gate driver circuit 322a and the second gate electrode G2 of the second gate 82 in each of the plurality of bidirectional switches 1. Thus, although the output voltage of the first gate driver circuit 321a is as high as the output voltage of the second gate driver circuit 322a, the resistance value of the first gate resistor 26 is different from the resistance value of the second gate resistor 27. This allows the control system 302a to make the current flowing toward the first gate 81 different from the current flowing toward the second gate 82 and also make the first gate voltage Vg1 and the second gate voltage Vg2 different from each other. Consequently, in the control system 302a, the second gate voltage Vg2 may be less than the first gate voltage Vg1, thus reducing the saturated current Isat when each bidirectional switch 1 operates in the first diode state.

The electrical device 300b according to the third embodiment includes the control system 302a, and therefore, its bidirectional switch device 101 is no more easily damaged by heat than that of the electrical device 300a according to the second embodiment is.

The electrical device 300b according to the third embodiment, as well as the electrical device 300a according to the second embodiment, is applicable to, for example, the voltage step-down DC-DC converter 400 shown in FIG. 11 and the voltage step-up DC-DC converter 500 shown in FIG. 13.

Fourth Embodiment

Figure 16:
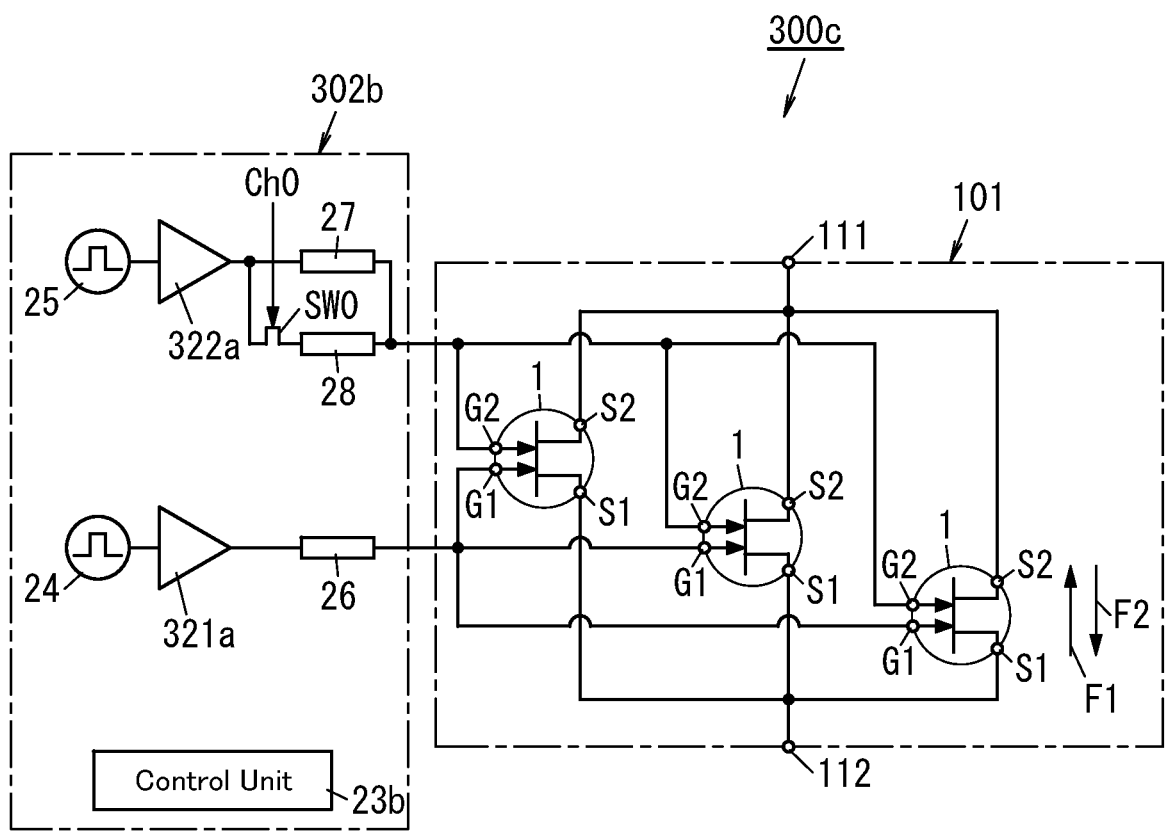
FIG. 16 is a circuit diagram of a switch system according to a fourth embodiment.

Next, an electrical device 300c according to a fourth embodiment will be described with reference to FIG. 16. The electrical device 300c is implemented as a switch system.

The electrical device 300c according to the fourth embodiment is almost the same as the electrical device 300b according to the third embodiment except that the electrical device 300c according to the fourth embodiment includes a control system 302b instead of the control system 302a, which is a major difference from the electrical device 300b according to the third embodiment. In the following description, any constituent element of the electrical device 300c according to this fourth embodiment, having the same function as a counterpart of the electrical device 300b according to the third embodiment described above, will be designated by the same reference numeral as that counterpart's, and description thereof will be omitted herein. The bidirectional switch 1 has the same configuration as the bidirectional switch 1 according to the first embodiment and description thereof will be omitted herein as appropriate. In FIG. 16, illustration of the terminal 8 shown in FIG. 6 is omitted.

The control system 302b, as well as the control system 302a, also applies the first gate voltage Vg1 and the second gate voltage Vg2 to the first gate 81 and the second gate 82, respectively, in each of the plurality of bidirectional switches 1 such that when each of the plurality of bidirectional switches 1 is in either the first diode state or the second diode state, the saturated current Isat has its value reduced to less than the magnitude Iin of an input current supplied to the bidirectional switch device 101.

The control system 302b further includes a switch SW0 and a third gate resistor 28. In the control system 302b, a series circuit of the switch SW0 and the third gate resistor 28 is connected to the second gate resistor 27 in parallel. The resistance value of the third gate resistor 28 is less than the resistance value of the second gate resistor 27. In this embodiment, the resistance value of the third gate resistor 28 is the same as the resistance value of the first gate resistor 26. Alternatively, the resistance value of the third gate resistor 28 may be different from the resistance value of the first gate resistor 26.

In this control system 302b, the resistance value of the first gate resistor 26 is determined such that the first gate voltage Vg1 becomes 3 V, for example, when the plurality of bidirectional switches 1 are controlled toward the bidirectional ON state. In addition, in the control system 302b, the respective resistance values of the second gate resistor 27 and the third gate resistor 28 are determined such that the second gate voltage Vg2 becomes 3 V, for example, when the plurality of bidirectional switches 1 are controlled toward the bidirectional ON state and that the switch SW0 is turned ON and the second gate voltage Vg2 is restricted to 2 V, for example, when the plurality of bidirectional switches 1 are controlled toward the first diode state.

The control system 302b includes a control unit 23b instead of the control unit 23a. The control unit 23b controls not only the first gate driver circuit 321a, the second gate driver circuit 322a, the first power supply 24, and the second power supply 25 but also the switch SW0 as well. The control unit 23b may be configured to control at least the switch SW0. The switch SW0 may be implemented as an FET (such as a GaN-based FET or a MOSFET). The switch SW0 is controlled by the control unit 23b.

The electrical device 300c according to the fourth embodiment includes the control system 302b, and therefore, its bidirectional switch device 101 is no more easily damaged by heat than that of the electrical device 300b according to the third embodiment is.

The electrical device 300c, as well as the electrical device 300a according to the second embodiment, is applicable to, for example, the voltage step-down DC-DC converter 400 shown in FIG. 11 and the voltage step-up DC-DC converter 500 shown in FIG. 13.

Figure 17:
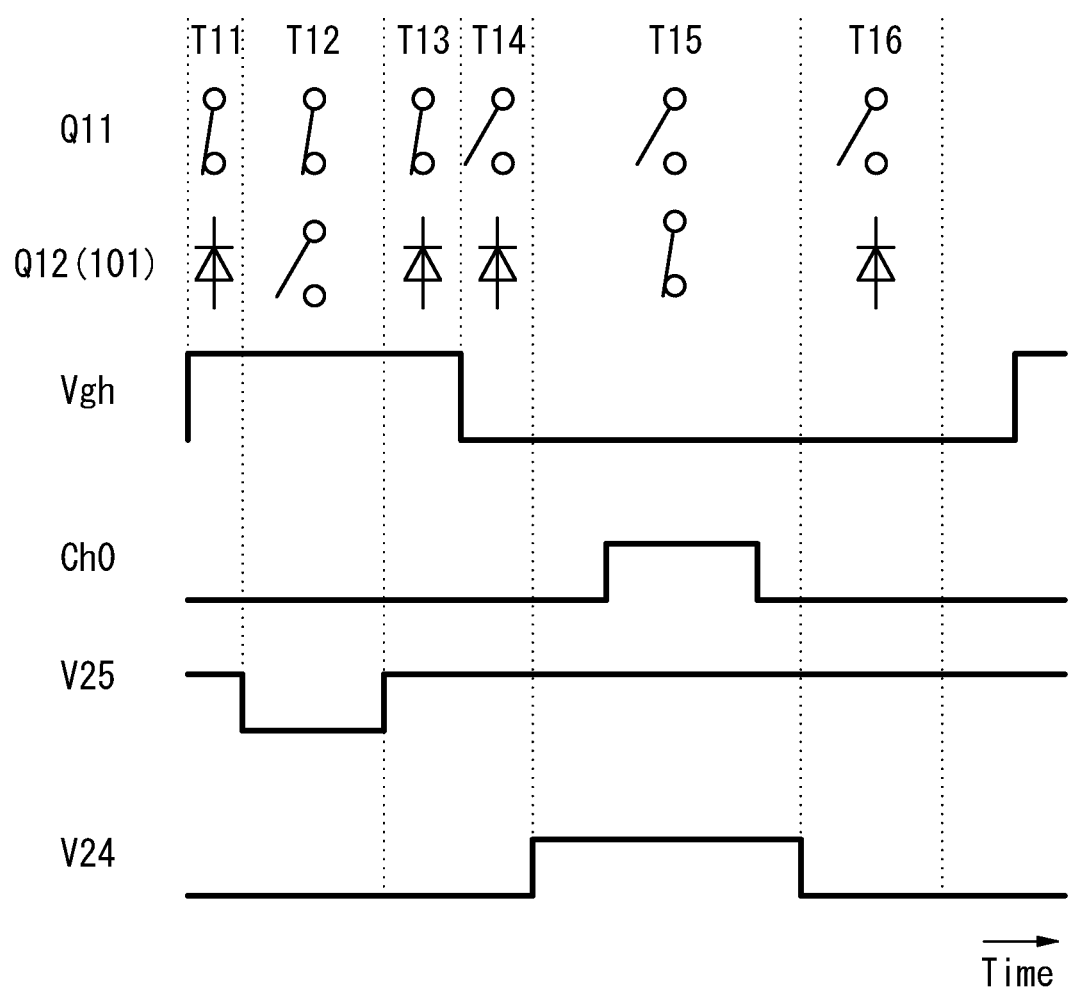
FIG. 17 shows how the switch system may operate when applied to a voltage step-down DC-DC converter.

When the electrical device 300c is applied to the voltage step-down DC-DC converter 400 shown in FIG. 11, the control unit 23b makes the high-side switch Q11, the low-side switch Q12, and the switch SW0 operate in accordance with the sequence shown in FIG. 17.

In FIG. 17, the respective operating states of the high-side switch Q11 and low-side switch Q12 in a plurality of periods T11-T16 are schematically indicated by symbols each representing either a switch or a diode. In FIG. 17, V24 indicates the output voltage of the first power supply 24, V25 indicates the output voltage of the second power supply 25, and Ch0 indicates the gate voltage applied from the control unit 23b to the switch SW0. The switch SW0 turns ON when the gate voltage is high and turns OFF when the gate voltage is low.

Specifically, in the period T11, the operating state of the high-side switch Q11 is ON state and the operating state of the low-side switch Q12 is the first diode state. In the period T12, the operating state of the high-side switch Q11 is ON state and the operating state of the low-side switch Q12 is the bidirectional OFF state. In the period T13, the operating state of the high-side switch Q11 is ON state and the operating state of the low-side switch Q12 is the first diode state. In the period T14, the operating state of the high-side switch Q11 is OFF state and the operating state of the low-side switch Q12 is the first diode state. In the period T15, the operating state of the high-side switch Q11 is OFF state and the operating state of the low-side switch Q12 is the bidirectional ON state. In the period T16, the operating state of the high-side switch Q11 is OFF state and the operating state of the low-side switch Q12 is the first diode state. In the period T12, the operating state of the low-side switch Q12 is bidirectional OFF state. However, this is only an example and should not be construed as limiting. Alternatively, the operating state of the low-side switch Q12 in the period T2 may also be the first diode state. In the period T15, the operating state of the low-side switch Q12 is the bidirectional ON state. However, this is only an example and should not be construed as limiting. Alternatively, the operating state of the low-side switch Q12 in the period T15 may also be the first diode state. The period during which the switch SW0 is ON begins later than a starting point of the period T15 in which the operating state of the low-side switch Q12 is the bidirectional ON state and ends earlier than the end point of the period T15. In the electrical device 300c, turning the switch SW0 ON allows the second gate voltage Vg2 to be increased compared to the second gate voltage Vg2 before the switch SW0 is turned ON. This may reduce the ON-state resistance of the bidirectional switch device 101, and eventually, reduce the conduction loss.

Fifth Embodiment

Figure 18:
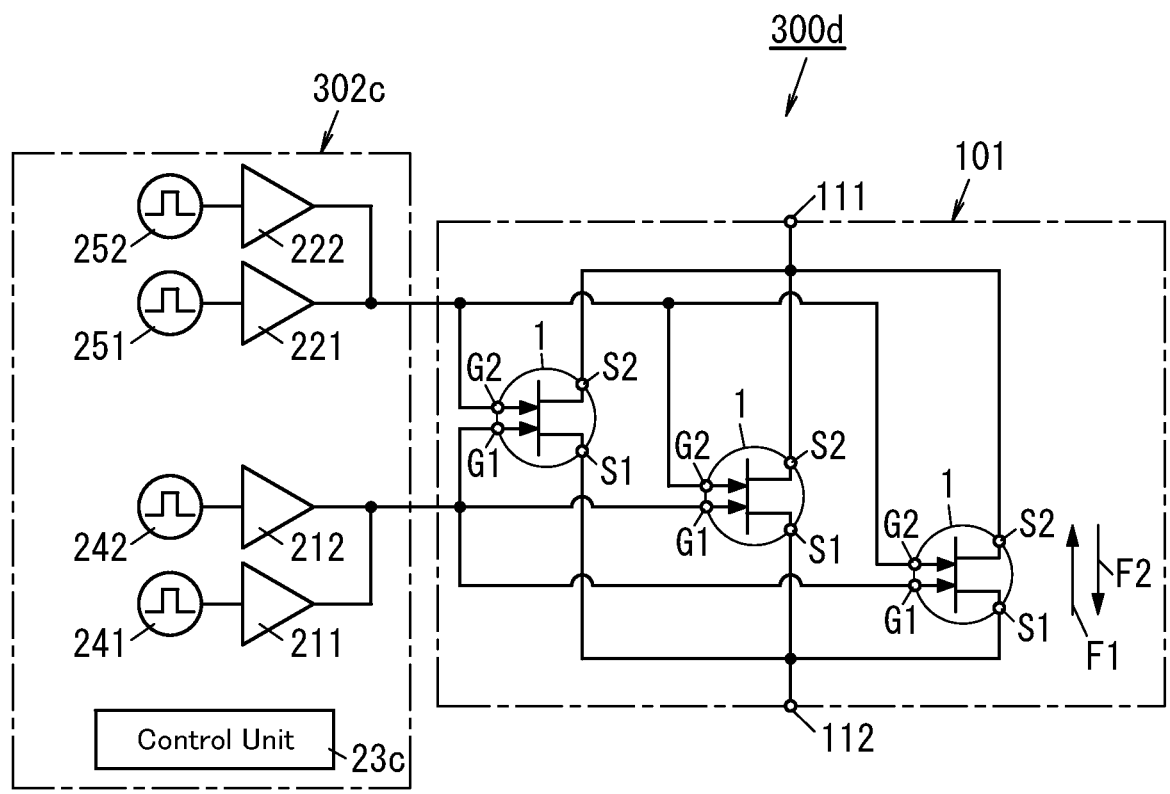
FIG. 18 is a circuit diagram of a switch system according to a fifth embodiment.

Next, an electrical device 300d according to a fifth embodiment will be described with reference to FIG. 18. The electrical device 300d is implemented as a switch system.

The electrical device 300d according to the fifth embodiment is almost the same as the electrical device 300a according to the second embodiment except that the electrical device 300d according to the fifth embodiment includes a control system 302c instead of the control system 302, which is a major difference from the electrical device 300a according to the second embodiment. In the following description, any constituent element of the electrical device 300d according to this fifth embodiment, having the same function as a counterpart of the electrical device 300a according to the second embodiment described above, will be designated by the same reference numeral as that counterpart's, and description thereof will be omitted herein. The bidirectional switch 1 has the same configuration as the bidirectional switch 1 according to the first embodiment and description thereof will be omitted herein as appropriate. In FIG. 18, illustration of the terminal 8 shown in FIG. 6 is omitted.

The control system 302c, as well as the control system 302, also applies the first gate voltage Vg1 and the second gate voltage Vg2 to the first gate electrode G1 and the second gate electrode G2, respectively, in each of the plurality of bidirectional switches 1 such that when each of the plurality of bidirectional switches 1 is in either the first diode state or the second diode state, the saturated current Isat has its value reduced to less than the magnitude Iin of an input current supplied to the bidirectional switch device 101.

The control system 302c includes two first gate driver circuits 211, 212, two second gate driver circuits 221, 222, two first power supplies 241, 242, and two second power supplies 251, 252. The control system 302c further includes a control unit 23c.

In the control system 302c, the two first gate driver circuits 211, 212 are connected one to one to the two first power supplies 241, 242, respectively. In addition, in this control system 302c, the respective output terminals of the two first gate driver circuits 211, 212 are connected to the first gate electrode G1 of the first gate 81 in each of the plurality of bidirectional switches 1. In this control system 302c, the magnitude of the output voltage of the first gate driver circuit 211 and the magnitude of the output voltage of the first gate driver circuit 212 are different from each other. The magnitude of the output voltage of the first gate driver circuit 211 may be 3 V, for example. The magnitude of the output voltage of the first gate driver circuit 212 is determined to limit the saturated current Isat of the current flowing in the second direction F2 in the second diode state. The magnitude of the output voltage of the first gate driver circuit 212 is less than the magnitude of the output voltage of the first gate driver circuit 211 and may be 2 V, for example.

Also, in the control system 302c, the two second gate driver circuits 221, 222 are connected one to one to the two second power supplies 251, 252, respectively. In addition, in this control system 302c, the respective output terminals of the two second gate driver circuits 221, 222 are connected to the second gate electrode G2 of the second gate 82 in each of the plurality of bidirectional switches 1. In this control system 302c, the magnitude of the output voltage of the second gate driver circuit 221 and the magnitude of the output voltage of the second gate driver circuit 222 are different from each other. The magnitude of the output voltage of the second gate driver circuit 221 may be 3 V, for example. The magnitude of the output voltage of the second gate driver circuit 222 is determined to limit the saturated current Isat of the current flowing in the first direction F1 in the first diode state. The magnitude of the output voltage of the second gate driver circuit 222 is less than the magnitude of the output voltage of the second gate driver circuit 221 and may be 2 V, for example.

In this control system 302c, the magnitude of the output voltage of one first gate driver circuit 211 out of the two first gate driver circuits 211, 212 is the same as the magnitude of the output voltage of one second gate driver circuit 221 out of the two second gate driver circuits 221, 222. The magnitude of the output voltage of the other first gate driver circuit 212 is the same as the magnitude of the output voltage of the other second gate driver circuit 222. Thus, in this control system 302c, the first gate driver circuit 211 and the second gate driver circuit 221 may have the same circuit configuration in common. In addition, in this control system 302c, the first gate driver circuit 212 and the second gate driver circuit 222 may have the same circuit configuration in common.

In the control system 302c, the two first power supplies 241, 242 are the same power supply. The two second power supplies 251, 252 are also the same power supply.

In this control system 302c, the control unit 23c controls the two first gate driver circuits 211, 212 and the two second gate driver circuits 221, 222. This allows the control system 302c to switch the plurality of bidirectional switches 1 from the first diode state in which a current is allowed to flow in the first direction F1 to the second diode state in which a current is allowed to flow in the second direction F2, and vice versa.

The electrical device 300d according to the fifth embodiment includes the control system 302c, and therefore, its bidirectional switch device 101 is no more easily damaged by heat than that of the electrical device 300a according to the second embodiment is.

Figure 19:
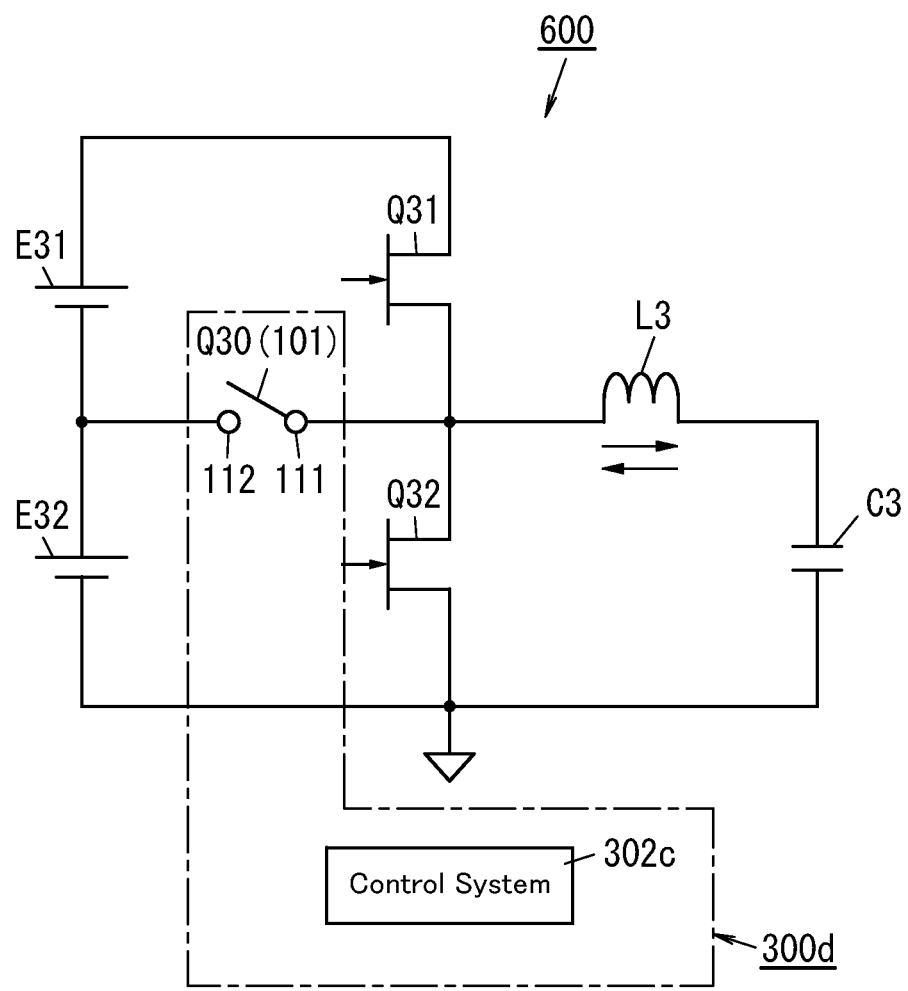
FIG. 19 is a circuit diagram of a three-level inverter circuit to which the switch system is applied.

The electrical device 300d is applicable to, for example, a three-level inverter 600 such as the one shown in FIG. 19. The three-level inverter 600 shown in FIG. 19 is a T-type three-level inverter. In this case, the three-level inverter 600 includes: a series circuit of a high-side switch Q31 and a low-side switch Q32; and a bidirectional switch element Q30 connected to the node of connection between the high-side switch Q31 and the low-side switch Q32. In this three-level inverter 600, a series circuit of two DC power supplies E31 and E32 is connected between both terminals of the series circuit of the high-side switch Q31 and the low-side switch Q32. In addition, in this three-level inverter 600, the bidirectional switch element Q30 is connected between the connection node of the high-side switch Q31 and the low-side switch Q32 and the connection node of the two DC power supplies E31, E32. Each of the high-side switch Q31 and the low-side switch Q32 may be implemented as, for example, a GaN-based FET. The bidirectional switch element Q30 is the bidirectional switch device 101.

The control unit 23c (see FIG. 18) of the control system 302c controls not only the bidirectional switch element Q30 but also the high-side switch Q31 and the low-side switch Q32 as well. Note that the basic operation of the three-level inverter is described, for example, in WO 2013/099053 A1, and description thereof will be omitted herein.

The control unit 23c controls not only the bidirectional switch element Q30 but also the high-side switch Q31 and the low-side switch Q32 as well. However, this is only an example and should not be construed as limiting. Alternatively, the control unit 23c does not have to control the high-side switch Q31 and the low-side switch Q32. In that case, the three-level inverter 600 may include another control device for controlling the high-side switch Q31 and the low-side switch Q32 separately from the control unit 23c.

Sixth Embodiment

Figure 20:
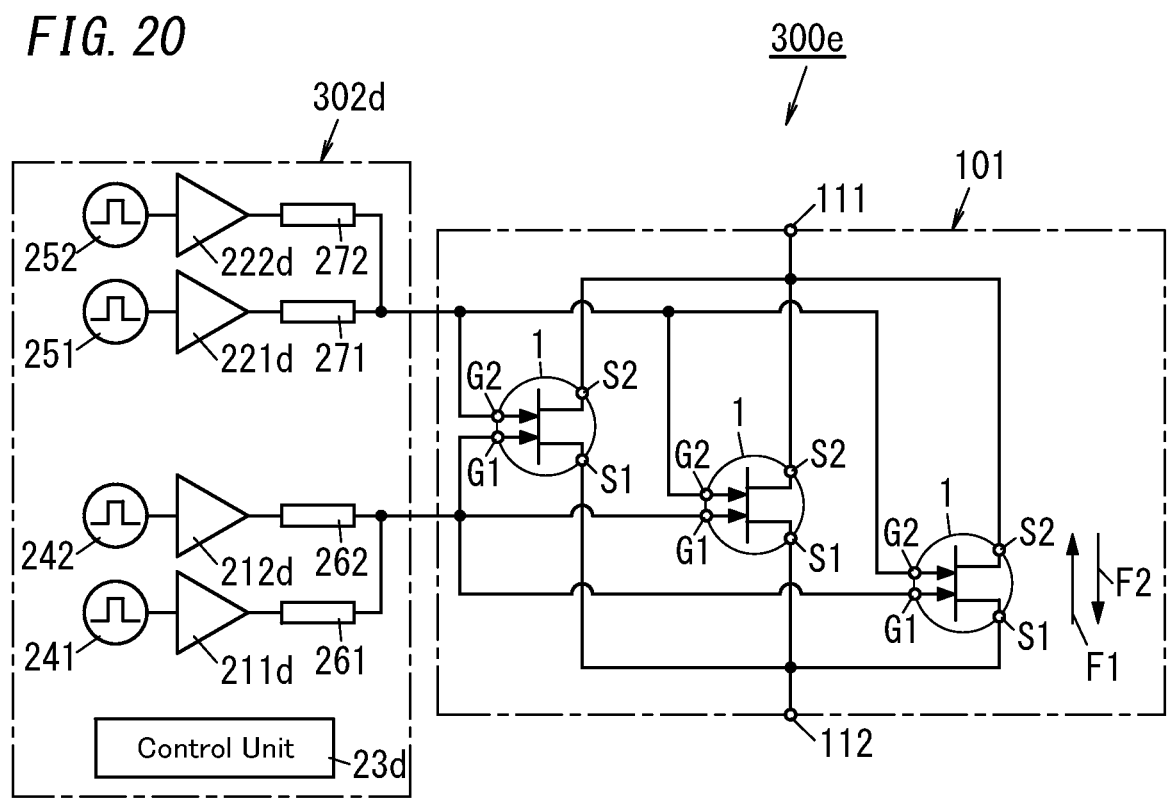
FIG. 20 is a circuit diagram of a switch system according to a sixth embodiment.

Next, an electrical device 300e according to a sixth embodiment will be described with reference to FIG. 20. The electrical device 300e is implemented as a switch system.

The electrical device 300e according to the sixth embodiment is almost the same as the electrical device 300d according to the fifth embodiment except that the electrical device 300e according to the sixth embodiment includes a control system 302d instead of the control system 302c, which is a major difference from the electrical device 300d according to the fifth embodiment. In the following description, any constituent element of the electrical device 300e according to this sixth embodiment, having the same function as a counterpart of the electrical device 300d according to the fifth embodiment described above, will be designated by the same reference numeral as that counterpart's, and description thereof will be omitted herein. The bidirectional switch 1 has the same configuration as the bidirectional switch 1 according to the first embodiment and description thereof will be omitted herein as appropriate. In FIG. 20, illustration of the terminal 8 shown in FIG. 6 is omitted.

The control system 302d, as well as the control system 302c, also applies the first gate voltage Vg1 and the second gate voltage Vg2 to the first gate electrode G1 and the second gate electrode G2, respectively, in each of the plurality of bidirectional switches 1 such that when each of the plurality of bidirectional switches 1 is in either the first diode state or the second diode state, the saturated current Isat has its value reduced to less than the magnitude Iin of an input current supplied to the bidirectional switch device 101.

The control system 302c includes two first gate driver circuits 211d, 212d, two second gate driver circuits 221d, 222d, the two first power supplies 241, 242, and the two second power supplies 251, 252. The control system 302c further includes two first gate resistors 261, 262 and two second gate resistors 271, 272. In addition, the control system 302d includes a control unit 23d instead of the control unit 23c.

In this control system 302d, the two first gate driver circuits 211d, 212d are connected one to one to the two first gate resistors 261, 262, respectively. In this case, one terminal of the first gate resistor 261 is connected to the output terminal of the first gate driver circuit 211d and the other terminal of the first gate resistor 261 is connected to the first gate electrode G1 of the first gate 81 in each of the plurality of bidirectional switches 1. In addition, one terminal of the first gate resistor 262 is connected to the output terminal of the first gate driver circuit 212d and the other terminal of the first gate resistor 262 is connected to the first gate electrode G1 of the first gate 81 in each of the plurality of bidirectional switches 1.

In this control system 302d, the two first gate driver circuits 211d, 212d have the same circuit configuration and the magnitudes of their output voltages are also the same. In addition, in this control system 302d, the resistance values of the two first gate resistors 261, 262 are different from each other. In this case, the resistance value of the first gate resistor 261 is smaller than the resistance value of the first gate resistor 262.

In this control system 302d, the respective resistance values of the two first gate resistors 261, 262 are determined such that the first gate voltage Vg1 becomes 3 V, for example, when the plurality of bidirectional switches 1 are controlled toward the bidirectional ON state and that the first gate voltage Vg1 is restricted to 2 V, for example, when the plurality of bidirectional switches 1 are controlled toward the second diode state.

In this control system 302d, the two second gate driver circuits 212d, 222d have the same circuit configuration and the magnitudes of their output voltages are also the same. In addition, in this control system 302d, the resistance values of the two second gate resistors 271, 272 are different from each other. In this case, the resistance value of the second gate resistor 271 is smaller than the resistance value of the second gate resistor 272.

In this control system 302d, the respective resistance values of the two second gate resistors 271, 272 are determined such that the second gate voltage Vg2 becomes 3 V, for example, when the plurality of bidirectional switches 1 are controlled toward the bidirectional ON state and that the second gate voltage Vg2 is restricted to 2 V, for example, when the plurality of bidirectional switches 1 are controlled toward the first diode state.

The control unit 23d changes the respective magnitudes of the first gate voltage Vg1 and second gate voltage Vg2 by controlling the two first gate driver circuits 211d, 212d, the two second gate driver circuits 221d, 222d, the two first power supplies 241, 242, and the two second power supplies 251, 252.

The electrical device 300e according to the sixth embodiment includes the control system 302d, and therefore, its bidirectional switch device 101 is no more easily damaged by heat than that of the electrical device 300d according to the fifth embodiment is.

Figure 21:
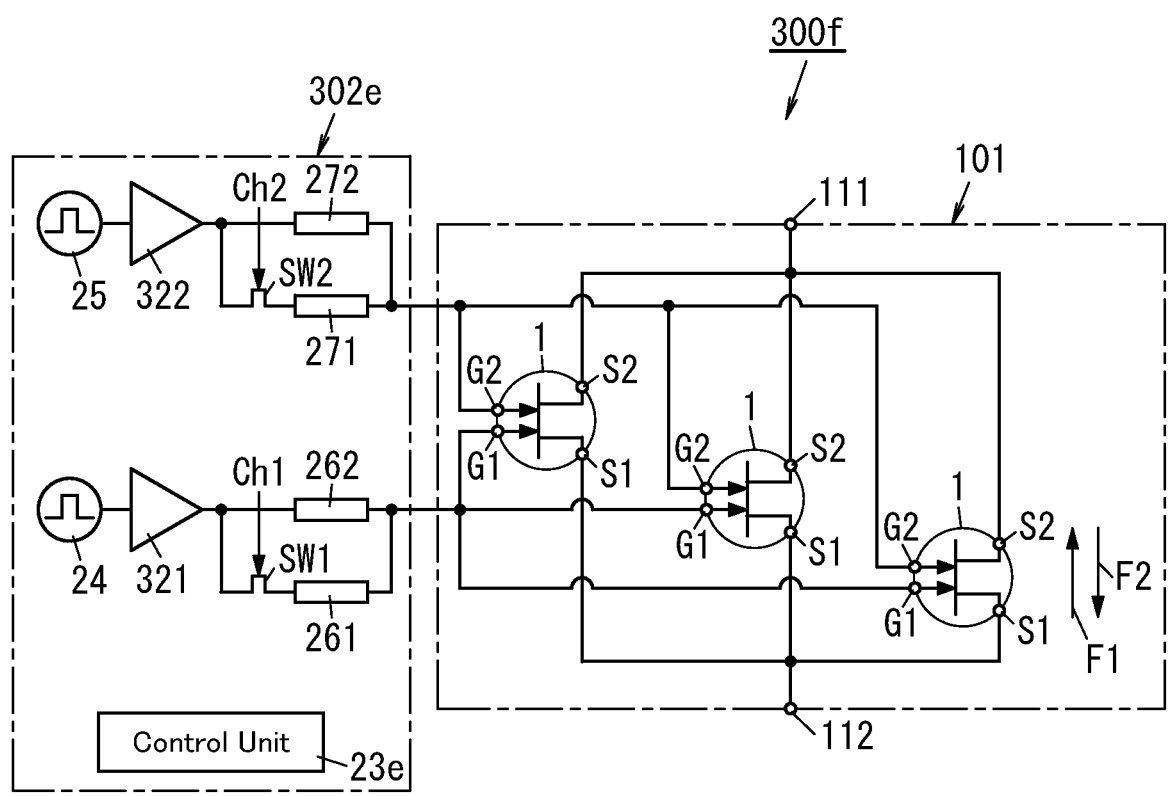
FIG. 21 is a circuit diagram of a switch system according to a seventh embodiment.

(Seventh embodiment) Next, an electrical device 300f according to a seventh embodiment will be described with reference to FIG. 21. The electrical device 300f is implemented as a switch system.

The electrical device 300f according to the seventh embodiment is almost the same as the electrical device 300e according to the sixth embodiment except that the electrical device 300f according to the seventh embodiment includes a control system 302e instead of the control system 302d, which is a major difference from the electrical device 300e according to the sixth embodiment. In the following description, any constituent element of the electrical device 300f according to this seventh embodiment, having the same function as a counterpart of the electrical device 300e according to the sixth embodiment described above, will be designated by the same reference numeral as that counterpart's, and description thereof will be omitted herein. The bidirectional switch 1 has the same configuration as the bidirectional switch 1 according to the first embodiment and description thereof will be omitted herein as appropriate. In FIG. 21, illustration of the terminal 8 shown in FIG. 6 is omitted.

The control system 302e, as well as the control system 302d, also applies the first gate voltage Vg1 and the second gate voltage Vg2 to the first gate electrode G1 and the second gate electrode G2, respectively, in each of the plurality of bidirectional switches 1 such that when each of the plurality of bidirectional switches 1 is in either the first diode state or the second diode state, the saturated current Isat has its value reduced to less than the magnitude Tin of an input current supplied to the bidirectional switch device 101.

The control system 302e includes the first power supply 24, the first gate driver circuit 321, the two first gate resistors 261, 262, a first voltage regulating switch SW1, the second power supply 25, the second gate driver circuit 322, the two second gate resistors 271, 272, and a second voltage regulating switch SW2.

In this control system 302e, one terminal of the first gate resistor 262 is connected to the output terminal of the first gate driver circuit 321 and the other terminal of the first gate resistor 262 is connected to the first gate electrode G1 of the first gate 81 in each of the plurality of bidirectional switches 1. In addition, in this control system 302e, a series circuit of the first voltage regulating switch SW1 and the first gate resistor 261 is connected to the first gate resistor 262 in parallel. The resistance values of the two first gate resistors 261, 262 are different from each other. In this case, the resistance value of the first gate resistor 261 is less than the resistance value of the first gate resistor 262.

In addition, in this control system 302e, one terminal of the second gate resistor 272 is connected to the output terminal of the second gate driver circuit 322 and the other terminal of the second gate resistor 272 is connected to the second gate electrode G2 of the second gate 82 in each of the plurality of bidirectional switches 1. In addition, in this control system 302e, a series circuit of the second voltage regulating switch SW2 and the second gate resistor 271 is connected to the second gate resistor 272 in parallel. The resistance values of the two second gate resistors 271, 272 are different from each other. In this case, the resistance value of the second gate resistor 271 is less than the resistance value of the second gate resistor 272.

In this control system 302e, the respective resistance values of the two first gate resistors 261, 262 are determined such that the first gate voltage Vg1 becomes 3 V, for example, when the plurality of bidirectional switches 1 are controlled toward the bidirectional ON state and that the first gate voltage Vg1 is restricted to 2 V, for example, when the plurality of bidirectional switches 1 are controlled toward the second diode state. In addition, in this control system 302e, the respective resistance values of the two second gate resistors 271, 272 are determined such that the second gate voltage Vg2 becomes 3 V, for example, when the plurality of bidirectional switches 1 are controlled toward the bidirectional ON state and that the second gate voltage Vg2 is restricted to 2 V, for example, when the plurality of bidirectional switches 1 are controlled toward the first diode state.

The control system 302e includes a control unit 23e instead of the control unit 23d. The control unit 23e controls not only the first gate driver circuit 321, the second gate driver circuit 322, the first power supply 24, and the second power supply 25 but also the first voltage regulating switch SW1 and the second voltage regulating switch SW2 as well. The control unit 23e may be configured to control at least the first voltage regulating switch SW1 and the second voltage regulating switch SW2. Each of the first voltage regulating switch SW1 and the second voltage regulating switch SW2 may be implemented as an FET (such as a GaN-based FET or a MOSFET).

The electrical device 300f according to the seventh embodiment includes the control system 302e, and therefore, its bidirectional switch device 101 is no more easily damaged by heat than that of the electrical device 300e according to the sixth embodiment is.

The electrical device 300f according to the seventh embodiment, as well as the electrical device 300e according to the sixth embodiment, is applicable to, for example, a three-level inverter 600 such as the one shown in FIG. 19. In the three-level inverter 600, the specifics of control to be performed by the control unit 23e vary according to the polarity of an output current. The polarity of the output current of the three-level inverter 600 is supposed to be positive when the output current flows from the inductor L3 toward the capacitor C3 and negative when the output current flows from the capacitor C3 toward the inductor L3.

Figure 22:
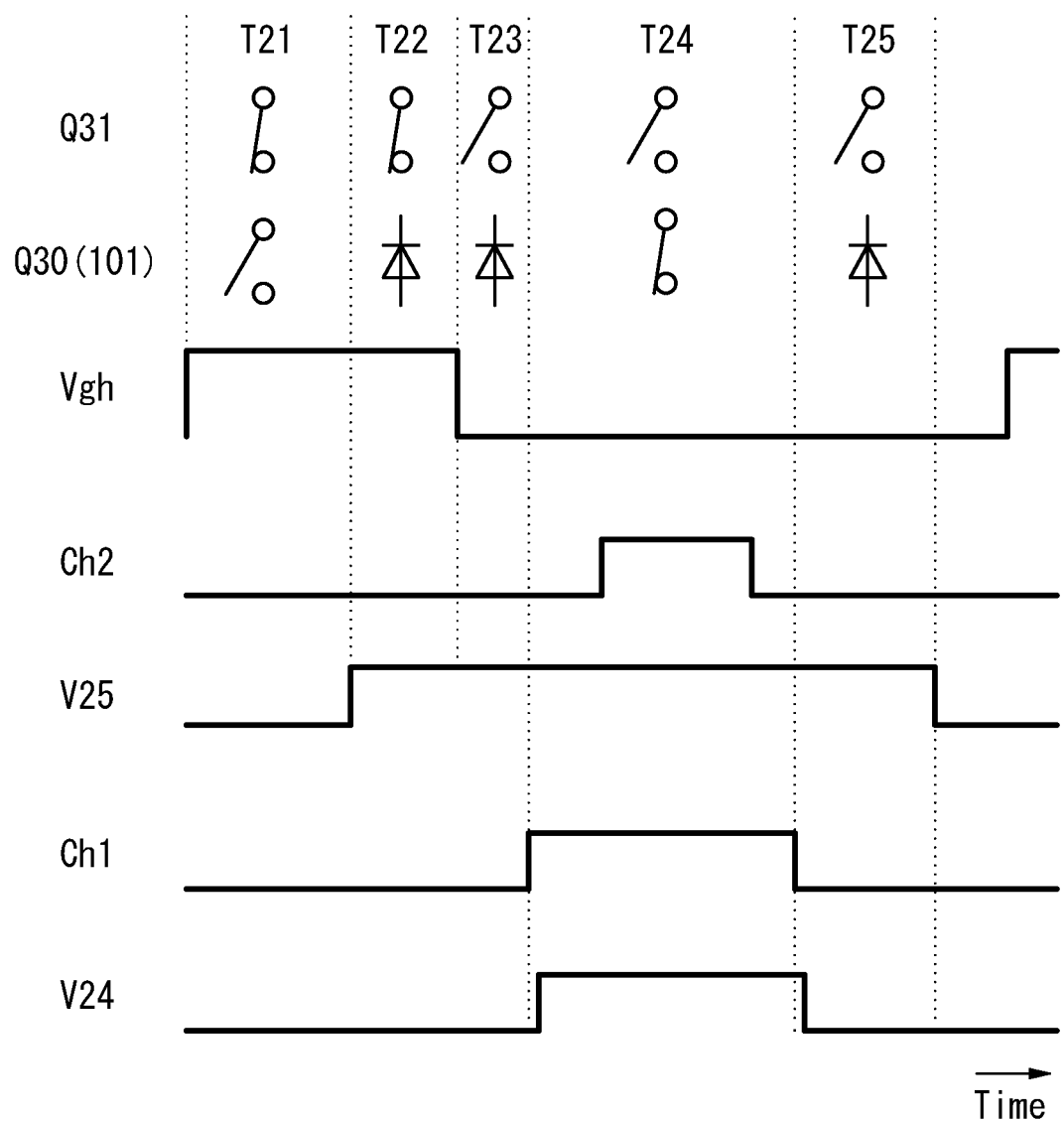
FIG. 22 shows how the switch system may operate when applied to a three-level inverter circuit.

If the polarity of the output current of the three-level inverter 600 is positive, then the control unit 23e makes the high-side switch Q31 and the bidirectional switch element Q30 (bidirectional switch device 101) operate in accordance with the sequence shown in FIG. 22, for example. In FIG. 22, the respective operating states of the high-side switch Q31 and bidirectional switch element Q30 in a plurality of periods T21-T25 are schematically indicated by symbols each representing either a switch or a diode. In FIG. 22, V24 indicates the output voltage of the first power supply 24, V25 indicates the output voltage of the second power supply 25, Ch1 indicates the gate voltage applied from the control unit 23e to the first voltage regulating switch SW1, and Ch2 indicates the gate voltage applied from the control unit 23e to the second voltage regulating switch SW2. Each of the first voltage regulating switch SW1 and second voltage regulating switch SW2 turns ON when the gate voltage is high and turns OFF when the gate voltage is low.

Specifically, in the period T21, the operating state of the high-side switch Q31 is ON state and the operating state of the bidirectional switch element Q30 is the bidirectional OFF state. In the period T22, the operating state of the high-side switch Q31 is ON state and the operating state of the bidirectional switch element Q30 is the first diode state. In the period T23, the operating state of the high-side switch Q31 is OFF state and the operating state of the bidirectional switch element Q30 is the first diode state. In the period T24, the operating state of the high-side switch Q31 is OFF state and the operating state of the bidirectional switch element Q30 is the bidirectional ON state. In the period T25, the operating state of the high-side switch Q31 is OFF state and the operating state of the bidirectional switch element Q30 is the first diode state.

The period during which the second voltage regulating switch SW2 is ON begins later than a starting point of the period T24, out of the periods T22, T23, T24, and T25 in which the operating state of the high-side switch Q31 is the bidirectional ON state, and ends earlier than the end point of the period T24. In the electrical device 300f, turning the second voltage regulating switch SW2 ON allows the second gate voltage Vg2 to be increased compared to the second gate voltage Vg2 before the second voltage regulating switch SW2 is turned ON. This may reduce the ON-state resistance of the bidirectional switch device 101, and eventually, reduce the conduction loss.

Optionally, the timing when the output voltage V24 of the first power supply 24 rises may be the same as the timing when the gate voltage Ch1 rises. However, setting the timing when the gate voltage Ch1 rises at an earlier timing allows the bidirectional switch device 101 to be switched more quickly. The timing when the output voltage V24 of the first power supply 24 falls may be the same as the timing when the gate voltage Ch1 falls. However, setting the timing when the gate voltage Ch1 falls at an earlier timing allows the bidirectional switch device 101 to be switched more quickly.

Eighth Embodiment

Figure 23:
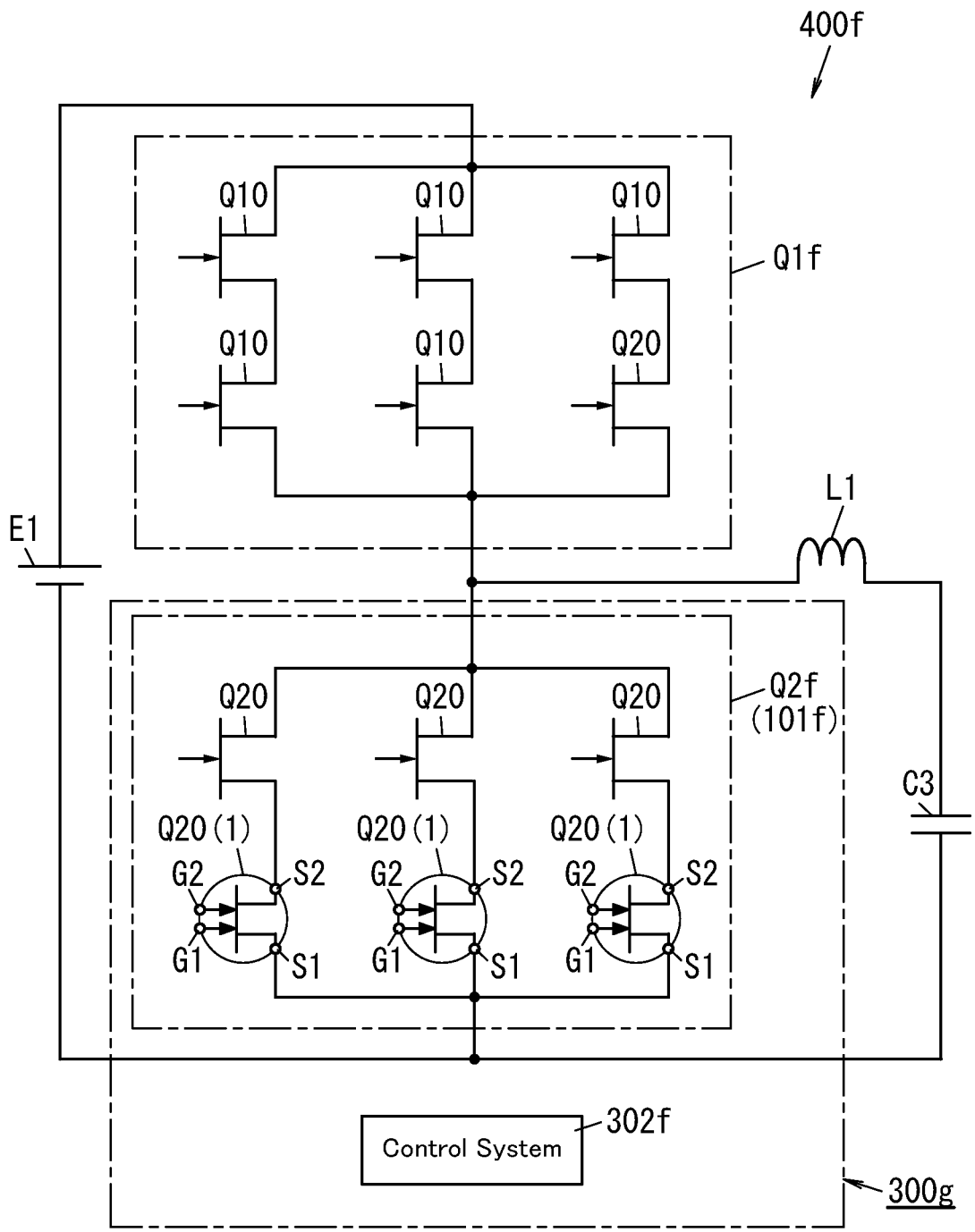
FIG. 23 is a circuit diagram of a switch system according to an eighth embodiment.

Next, an electrical device 300g according to an eighth embodiment will be described with reference to FIG. 23. FIG. 23 is a circuit diagram of a voltage step-down DC-DC converter 400f to which the electrical device 300g is applied. The electrical device 300g is implemented as a switch system.

The electrical device 300g according to the eighth embodiment is almost the same as the electrical device 300a according to the second embodiment except that the electrical device 300g according to the eighth embodiment includes a bidirectional switch device 101f instead of the bidirectional switch device 101 and includes a control system 302f instead of the control system 302, which are major differences from the electrical device 300a according to the second embodiment. In the following description, any constituent element of the electrical device 300g according to this eighth embodiment, having the same function as a counterpart of the electrical device 300a according to the second embodiment described above, will be designated by the same reference numeral as that counterpart's, and description thereof will be omitted herein.

The voltage step-down DC-DC converter 400f includes a high-side switch Q1f and a low-side switch Q2f instead of the high-side switch Q11 and low-side switch Q12, respectively, of the voltage step-down DC-DC converter 400 (see FIG. 11).

The high-side switch Q1f is formed by connecting three first basic circuits in parallel. Each of the three first basic circuits is formed by connecting two field effect transistors Q10 in series. Each field effect transistor Q10 of the high-side switch Q1f may be implemented as, for example, a GaN-based FET.

The low-side switch Q2f is the bidirectional switch device 101f.

The bidirectional switch device 101f has generally the same configuration as the bidirectional switch device 101 except that the bidirectional switch device 101f includes a plurality of (e.g., three) field effect transistors Q20 which are connected one to one to a plurality of (e.g., three) bidirectional switches 1, respectively, in series. In this case, the bidirectional switch device 101f is formed by connecting a predetermined number of (three) second basic circuits in parallel. Each of the three second basic circuits is formed by connecting a plurality of (two) field effect transistors Q20 in series. In each of the predetermined number of second basic circuits, at least one field effect transistor Q20, out of the plurality of field effect transistors Q20, is the bidirectional switch 1. In each second basic circuit, one field effect transistor Q20 is the bidirectional switch 1 and the other field effect transistor Q20 is a GaN-based FET. The bidirectional switch 1 has the same configuration as the bidirectional switch 1 according to the first embodiment and description thereof will be omitted herein as appropriate. In FIG. 23, illustration of the terminal 8 shown in FIG. 6 is omitted.

The control system 302f, as well as the control system 302, also applies the first gate voltage Vg1 and the second gate voltage Vg2 to (the first gate electrode G1 of) the first gate 81 and (the second gate electrode G2 of) the second gate 82, respectively, in each of the plurality of bidirectional switches 1 such that when each of the plurality of bidirectional switches 1 is in either the first diode state or the second diode state, the saturated current Isat has its value reduced to less than the magnitude Iin of an input current supplied to the bidirectional switch device 101.

The electrical device 300g according to the eighth embodiment includes the control system 302f, and therefore, its bidirectional switch device 101f is no more easily damaged by heat than that of the electrical device 300a according to the second embodiment is.

Note that the second to eighth embodiments described above are only exemplary ones of various embodiments of the present disclosure and should not be construed as limiting. Rather, the second to eighth exemplary embodiments may be readily modified in various manners depending on a design choice or any other factor without departing from the scope of the present disclosure.

For example, each of the first p-type layer and the second p-type layer does not have to be the p-type AlGaN layer but may also be a p-type GaN layer. Alternatively, each of the first p-type layer and the second p-type layer may also be a p-type metal-oxide semiconductor layer, for example. The p-type metal-oxide semiconductor layer may be an NiO layer, for example. The NiO layer may contain, as an impurity, at least one alkali metal selected from the group consisting of lithium (Li), sodium (Na), potassium (K), rubidium (Rb), and cesium (Cs). The NiO layer may also contain, for example, a transition metal such as silver (Ag) or copper (Cu) which becomes univalent when added as an impurity.

For example, the bidirectional switch 1 may include one or more nitride semiconductor layers between the buffer layer 3 and the first nitride semiconductor layer (GaN layer 4). Also, the buffer layer 3 does not have to have a single-layer structure but may also have a superlattice structure, for example.

Furthermore, the substrate 2 does not have to be a silicon substrate but may also be a GaN substrate, an SiC substrate, or a sapphire substrate, for example.

The bidirectional switch for use instead of the bidirectional switch 1 does not have to be a dual-gate GaN-based GIT. Alternatively, the bidirectional switch may also be a bidirectional switch formed by connecting the respective drain electrodes of two MOSFETs together, a bidirectional switch formed by connecting the respective source electrodes of two MOSFETs together, or a bidirectional switch formed by connecting a series circuit of a first IGBT and a first diode and a series circuit of a second IGBT and a second diode antiparallel. In this case, the MOSFET may be an Si-based MOSFET or an SiC-based MOSFET, whichever is appropriate. Furthermore, the bidirectional switch for use instead of the bidirectional switch 1 may be a bidirectional switch formed by connecting the respective drain electrodes of two MESFETs together or a bidirectional switch formed by connecting the respective source electrodes of two MESFETs together.

(Recapitulation)

The first to eighth embodiments and their variations described above may be specific implementations of the following aspects of the present disclosure.

A bidirectional switch (1) according to a first aspect includes a substrate (2), a GaN layer (4), an AlGaN layer (5), a first source electrode (S1), a first gate electrode (G1), a second gate electrode (G2), a second source electrode (S2), a first p-type $Al_{x1}Ga_{1-x1}N$ layer (61), and a second p-type $Al_{x2}Ga_{1-x2}N$ layer (62). In this bidirectional switch (1), $0 \leq x1 < 1$ and $0 \leq x2 < 1$ are satisfied. The substrate (2) has electrical conductivity. The GaN layer (4) is formed over the substrate (2). The AlGaN layer (5) is formed on the GaN layer (4). The first source electrode (S1), the first gate electrode (G1), the second gate electrode (G2), and the second source electrode (S2) are formed on or over the AlGaN layer (5). The first p-type $Al_{x1}Ga_{1-x1}N$ layer (61) is interposed between the first gate electrode (G1) and the AlGaN layer (5). The second p-type $Al_{x2}Ga_{1-x2}N$ layer (62) is interposed between the second gate electrode (G2) and the AlGaN layer (5). The substrate (2) is electrically insulated from all of the first source electrode (S1), the second source electrode (S2), the first gate electrode (G1), and the second gate electrode (G2). The bidirectional switch (1) further includes a terminal (8) used to connect the substrate (2) to a fixed potential node. The terminal (8) is connected to the substrate (2).

The bidirectional switch (1) according to the first aspect may reduce the current collapse.

An electrical device (300; 300a; 300b; 300c; 300d; 300e; 300f; 300g) according to a second aspect includes the bidirectional switch (1) of the first aspect. The terminal (8) of the bidirectional switch (1) is connected to the fixed potential node.

The electrical device (300; 300a; 300b; 300c; 300d; 300e; 300f; 300g) according to the second aspect may reduce the current collapse.

In an electrical device (300; 300a; 300b; 300c; 300d; 300e; 300f; 300g) according to a third aspect, which may be implemented in conjunction with the second aspect, the fixed potential node is one terminal of a DC power supply, or one output terminal of a rectifier smoothing circuit including a diode bridge, or a cathode of a Zener diode.

In an electrical device (300; 300a; 300b; 300c; 300d; 300e; 300f; 300g) according to a fourth aspect, which may be implemented in conjunction with the second aspect, the fixed potential node is one output terminal (TA2) selected from a pair of output terminals (TA1, TA2) of the diode bridge (DB) included in the rectifier smoothing circuit. The one output terminal (TA2) has a lower potential than the other output terminal (TA1) of the diode bridge (DB).

The electrical device (300; 300a; 300b; 300c; 300d; 300e; 300f; 300g) according to the fourth aspect may further reduce the current collapse compared to the third aspect.

In an electrical device (300; 300a; 300b; 300c; 300d; 300e; 300f; 300g) according to a fifth aspect, which may be implemented in conjunction with the second aspect, when the fixed potential node has a negative potential with respect to a ground potential as a reference potential, the absolute value of the negative potential is equal to or less than a predetermined value.

The electrical device (300; 300a; 300b; 300c; 300d; 300e; 300f; 300g) according to the fifth aspect may reduce the current collapse when the fixed potential node has a negative potential with respect to a ground potential as a reference potential.

An electrical device (300; 300a; 300b; 300c; 300d; 300e; 300f; 300g) according to a sixth aspect, which may be implemented in conjunction with any one of the second to fifth aspects, includes a bidirectional switch device (101; 101f) and a control system (302; 302a; 302b; 302c; 302d; 302e; 302f). The bidirectional switch device (101; 101f) includes a plurality of the bidirectional switches (1) and is formed by connecting the plurality of the bidirectional switches (1) in parallel. The control system (302; 302a; 302b; 302c; 302d; 302e; 302f) controls the bidirectional switch device (101; 101*f*). Each of the bidirectional switches (1) includes the first gate electrode (G1) and the second gate electrode (G2). Each of the plurality of the bidirectional switches (1) is switchable from one of a bidirectional ON state, a bidirectional OFF state, a first diode state, or a second diode state to another, according to a combination of a first gate voltage (Vg1) and a second gate voltage (Vg2) applied to the first gate electrode (G1) and the second gate electrode (G2), respectively. The bidirectional ON state is a state where bidirectional currents are allowed to flow. The bidirectional OFF state is a state where bidirectional currents are cut off. The first diode state is a state where a current is allowed to flow in a first direction (F1). The second diode state is a state where a current is allowed to flow in a second direction (F2) opposite from the first direction (F1). The control system (302; 302*a*; 302*b*; 302*c*; 302*d*; 302*e*; 302*f*) applies the first gate voltage (Vg1) and the second gate voltage (Vg2) to the first gate electrode (G1) and the second gate electrode (G2), respectively, in each of the plurality of the bidirectional switches (1) such that in each of the plurality of the bidirectional switches (1), a saturated current (Isat) when each of the plurality of bidirectional switches (1) is operating in either the first diode state or the second diode state has its current value reduced to less than magnitude of an input current (Iin) supplied to the bidirectional switch device (101; 101*f*).

The electrical device (300; 300*a*; 300*b*; 300*c*; 300*d*; 300*e*; 300*f*; 300*g*) according to the sixth aspect reduces the chances of the bidirectional switch device (101; 101*f*) being damaged by heat.

In an electrical device (300; 300*a*; 300*b*; 300*c*; 300*d*; 300*e*; 300*f*; 300*g*) according to a seventh aspect, which may be implemented in conjunction with the sixth aspect, the control system (302; 302*a*; 302*b*; 302*c*; 302*d*; 302*e*; 302*f*) applies the first gate voltage (Vg1) and the second gate voltage (Vg2) to the first gate electrode (G1) and the second gate electrode (G2), respectively, in each of the plurality of the bidirectional switches (1) such that in each of the plurality of the bidirectional switches (1), a saturated current (Isat) when each of the plurality of bidirectional switches (1) is operating in either the first diode state or the second diode state has its current value reduced to less than a rated current of each of the plurality of bidirectional switches (1).

The electrical device (300; 300*a*; 300*b*; 300*c*; 300*d*; 300*e*; 300*f*; 300*g*) according to the seventh aspect reduces the chances of the bidirectional switch device (101; 101*f*) being damaged by heat while allowing a larger amount of current to flow through the bidirectional switch device (101; 101*f*).

In an electrical device (300; 300*a*; 300*b*; 300*c*; 300*d*; 300*e*; 300*f*; 300*g*) according to an eighth aspect, which may be implemented in conjunction with the sixth or seventh aspect, the control system (302; 302*a*; 302*b*; 302*c*; 302*d*; 302*e*; 302*f*) applies the first gate voltage (Vg1) and the second gate voltage (Vg2) to the first gate electrode (G1) and the second gate electrode (G2), respectively, in each of the plurality of the bidirectional switches (1) such that in each of the plurality of the bidirectional switches (1), a saturated current (Isat) when each of the plurality of bidirectional switches (1) is operating in either the first diode state or the second diode state has its current value reduced to less than magnitude of a current flowing when each of the plurality of bidirectional switches (1) operates in the bidirectional ON state.

The electrical device (300; 300*a*; 300*b*; 300*c*; 300*d*; 300*e*; 300*f*; 300*g*) according to the eighth aspect reduces the chances of the bidirectional switch device (101; 101*f*) being damaged by heat by avoiding a situation where a current flows concentratedly through only any one of the plurality of bidirectional switches (1).

In an electrical device (300; 300*a*; 300*b*; 300*c*; 300*d*; 300*e*; 300*f*; 300*g*) according to a ninth aspect, which may be implemented in conjunction with any one of the sixth to eighth aspects, the plurality of bidirectional switches (1) includes three or more bidirectional switches (1). The control system (302; 302*a*; 302*b*; 302*c*; 302*d*; 302*e*; 302*f*) applies the first gate voltage (Vg1) and the second gate voltage (Vg2) to the first gate electrode (G1) and the second gate electrode (G2), respectively, in each of the plurality of the bidirectional switches (1) such that in each of two bidirectional switches (1) out of the three or more bidirectional switches (1), a total amount of current flowing when the bidirectional switch (1) is operating in the first diode state or the second diode state has its value reduced to less than magnitude (Iin) of an input current supplied to the bidirectional switch device (101; 101*f*).

A multi-level inverter according to a tenth aspect includes the bidirectional switch (1) according to the first aspect.

The multi-level inverter according to the tenth aspect may reduce the current collapse.

In an electrical device (300; 300*a*; 300*b*; 300*c*; 300*d*; 300*e*; 300*f*; 300*g*) according to an eleventh aspect, which may be implemented in conjunction with any one of the sixth to ninth aspects, each of the plurality of bidirectional switches (1) has a first diode structure (91) including a first gate (81) and a second diode structure (92) including a second gate (82).

The electrical device (300; 300*a*; 300*b*; 300*c*; 300*d*; 300*e*; 300*f*; 300*g*) according to the eleventh aspect may change the magnitude of the first gate voltage (Vg1) by varying the magnitude of the current flowing through the first gate (81) and change the magnitude of the second gate voltage (Vg2) by varying the magnitude of the current flowing through the second gate (82).

In an electrical device (300; 300*a*; 300*b*; 300*c*; 300*d*; 300*e*; 300*f*; 300*g*) according to a twelfth aspect, which may be implemented in conjunction with the eleventh aspect, the first gate (81) includes the first gate electrode (G1) and a first p-type $Al_{x1}Ga_{1-x1}N$ layer (61) which forms the first diode structure (91) along with the AlGaN layer (5). The second gate (82) includes the second gate electrode (G2) and a second p-type $Al_{x2}Ga_{1-x2}N$ layer (62) which forms the second diode structure (92) along with the AlGaN layer (5).

The electrical device (300; 300*a*; 300*b*; 300*c*; 300*d*; 300*e*; 300*f*; 300*g*) according to the twelfth aspect contributes to reducing the overall size and resistance of each of the plurality of bidirectional switches (1).

In an electrical device (300*a*) according to a thirteenth aspect, which may be implemented in conjunction with any one of the sixth to ninth, eleventh, and twelfth aspects, the control system (302) includes a first gate driver circuit (321) and a second gate driver circuit (322). The first gate driver circuit (321) is connected to respective first gate electrodes (G1) of the plurality of bidirectional switches (1). The second gate driver circuit (322) is connected to respective second gate electrodes (G2) of the plurality of bidirectional switches (1). The magnitude of the output voltage of the second gate driver circuit (322) is less than that of the output voltage of the first gate driver circuit (321).

In an electrical device (300*b*; 300*c*) according to a fourteenth aspect, which may be implemented in conjunction with the eleventh or twelfth aspect, the control system (302*a*; 302*b*) includes a first gate resistor (26), a first gate driver circuit (321*a*), a second gate resistor (27), and a second gate driver circuit (322a). The first gate resistor (26) is connected to the respective first gate electrodes (G1) of the plurality of bidirectional switches (1). The first gate driver circuit (321a) is connected to the respective first gate electrodes (G1) of the plurality of bidirectional switches (1) via the first gate resistor (26). The second gate resistor (27) is connected to the respective second gate electrodes (G2) of the plurality of bidirectional switches (1). The second gate driver circuit (322a) is connected to the second gate electrode (G2) of the plurality of bidirectional switches (1) via the second gate resistor (27). The resistance value of the first gate resistor (26) is smaller than the resistance value of the second gate resistor (27).

The electrical device (300b; 300c) according to the fourteenth aspect allows the first gate driver circuit (321a) and the second gate driver circuit (322a) to have the same circuit configuration.

In an electrical device (300c) according to a fifteen aspect, which may be implemented in conjunction with the fourteenth aspect, the control system (302b) further includes a series circuit of a switch (SW0) and a third gate resistor (28), which is connected to the second gate resistor (27) in parallel.

The electrical device (300c) according to the fifteen aspect may reduce the ON-state resistance of each of the plurality of bidirectional switches (1).

In an electrical device (300d) according to a sixteenth aspect, which may be implemented in conjunction with any one of the sixth to ninth, eleventh, and twelfth aspects, the control system (302c) includes two first gate driver circuits (211, 212) and two second gate driver circuits (221, 222). The two first gate driver circuits (211, 212) are connected to respective first gate electrodes (G1) of the plurality of bidirectional switches (1) and have output voltages of mutually different magnitudes. The two second gate driver circuits (221, 222) are connected to respective second gate electrodes (G2) of the plurality of bidirectional switches (1) and have output voltages of mutually different magnitudes.

The electrical device (300d) according to the sixteenth aspect may control the bidirectional switch device (101) to make the bidirectional switch device (101) operate in any of the bidirectional ON state, the bidirectional OFF state, the first diode state, or the second diode state.

In an electrical device (300e) according to a seventeenth aspect, which may be implemented in conjunction with the eleventh or twelfth aspect, the control system (302d) includes two first gate driver circuits (211d, 212d), two first gate resistors (261, 262), two second gate driver circuits (221d, 222d), and two second gate resistors (271, 272). The two first gate driver circuits (211d, 212d) are connected to the respective first gate electrodes (G1) of the plurality of bidirectional switches (1). The two first gate resistors (261, 262) are associated one to one with the two first gate driver circuits (211d, 212d), are each connected to an associated one of the first gate driver circuits and an associated one of the first gate electrodes (G1), and have mutually different resistance values. The two second gate driver circuits (221d, 222d) are connected to the respective second gate electrodes (G2) of the plurality of bidirectional switches (1). The two second gate resistors (271, 272) are associated one to one with the two second gate driver circuits (221d, 222d), are each connected to an associated one of the second gate driver circuits and an associated one of the second gate electrodes (G2), and have mutually different resistance values.

In an electrical device (300f) according to an eighteenth aspect, which may be implemented in conjunction with the eleventh or twelfth aspect, the control system (302e) includes a first gate driver circuit (321), a second gate driver circuit (322), two first gate resistors (261, 262), two second gate resistors (271, 272), a first voltage regulating switch (SW1), and a second voltage regulating switch (SW2). The two first gate resistors (261, 262) are connected to the first gate driver circuit (321) and the respective first gate electrodes (G1) of the plurality of bidirectional switches (1), have mutually different resistance values, and are connected together in parallel. The two second gate resistors (271, 272) are connected to the second gate driver circuit (322) and the respective second gate electrodes (G2) of the plurality of bidirectional switches (1), have mutually different resistance values, and are connected together in parallel. The first voltage regulating switch (SW1) is connected in series to one first gate resistor (261), having the smaller resistance value, out of the two first gate resistors (261, 262). The second voltage regulating switch (SW2) is connected in series to one second gate resistor (271), having the smaller resistance value, out of the two second gate resistors (271, 272).

The electrical device (300f) according to the eighteenth aspect may control the bidirectional switch device (101) to make the bidirectional switch device (101) operate in any of the bidirectional ON state, the bidirectional OFF state, the first diode state, or the second diode state.

In an electrical device (300g) according to a nineteenth aspect, which may be implemented in conjunction with any one of the sixth to ninth and eleventh to eighteenth aspects, the bidirectional switch device (101f) includes a predetermined number of basic circuits, each of which is formed by connecting a plurality of field effect transistors (Q20) in series and which are connected together in parallel. In each of the predetermined number of basic circuits, at least one of the plurality of field effect transistors (Q20) is the bidirectional switch (1).

The electrical device (300g) according to the nineteenth aspect contributes to increasing the breakdown voltage of the bidirectional switch device (101f).

A method for controlling a bidirectional switch device (101; 101f) according to a twentieth aspect is a method for controlling a bidirectional switch device (101; 101f) formed by connecting a plurality of bidirectional switches (1) in parallel. Each of the plurality of bidirectional switches (1) includes a first gate (81) and a second gate (82).

Each of the plurality of the bidirectional switches (1) is switchable from one of a bidirectional ON state, a bidirectional OFF state, a first diode state, or a second diode state to another, according to a combination of a first gate voltage (Vg1) and a second gate voltage (Vg2) applied to the first gate (81) and the second gate (82), respectively. The bidirectional ON state is a state where bidirectional currents are allowed to flow. The bidirectional OFF state is a state where bidirectional currents are cut off. The first diode state is a state where a current is allowed to flow in a first direction (F1). The second diode state is a state where a current is allowed to flow in a second direction (F2) opposite from the first direction (F1). The method for controlling the bidirectional switch device (101; 101f) includes applying the first gate voltage (Vg1) and the second gate voltage (Vg2) to the first gate (81) and the second gate (82), respectively, in each of the plurality of the bidirectional switches (1) such that in each of the plurality of the bidirectional switches (1), a saturated current (Isat) when the bidirectional switch (1) is operating in either the first diode state or the second diode state has its current value reduced to less than magnitude (Iin) of an input current supplied to the bidirectional switch device (101; 101f).

The method for controlling the bidirectional switch device (101; 101f) according to the twentieth aspect reduces the chances of the bidirectional switch device (101; 101f) being damaged by heat.

If the bidirectional switch (1) is used by itself to operate in either the first diode state or the second diode state, then the bidirectional switch (1) could be damaged by heat generated as the temperature of the bidirectional switch (1) rises.

In the electrical device (300a; 300b; 300c; 300d; 300e; 300f; 300g) according to the sixth aspect described above, the bidirectional switch device (101; 101f) is formed by connecting a plurality of bidirectional switches (1) in parallel. However, this is only an example and should not be construed as limiting. Alternatively, in an electrical device according to another aspect, the bidirectional switch device may be implemented as a single bidirectional switch (1).

The electrical device according to this another aspect includes a bidirectional switch device and a control system. The bidirectional switch device is implemented as a single bidirectional switch (1). The control system controls the bidirectional switch device. The bidirectional switch (1) includes a first gate electrode (G1) and a second gate electrode (G2). Each bidirectional switch (1) is switchable from one of a bidirectional ON state, a bidirectional OFF state, a first diode state, or a second diode state to another, according to a combination of a first gate voltage (Vg1) and a second gate voltage (Vg2) applied to the first gate electrode (G1) and the second gate electrode (G2), respectively. The bidirectional ON state is a state where bidirectional currents are allowed to flow. The bidirectional OFF state is a state where bidirectional currents are cut off. The first diode state is a state where a current is allowed to flow in a first direction (F1). The second diode state is a state where a current is allowed to flow in a second direction (F2) opposite from the first direction (F1). The control system applies the first gate voltage (Vg1) and the second gate voltage (Vg2) to the first gate electrode (G1) and the second gate electrode (G2), respectively, in the bidirectional switch (1) such that in the bidirectional switch (1), a saturated current (Isat) when the bidirectional switch (1) is operating in either the first diode state or the second diode state has its current value reduced to less than magnitude (Iin) of an input current supplied to the bidirectional switch device.

The electrical device according to this aspect reduces the chances of the bidirectional switch device being damaged by heat.

Optionally, each of the seventh to ninth aspects and the eleventh to nineteenth aspects is applicable as appropriate to the electrical device according to this another aspect with the definition about the plurality of bidirectional switches (1) changed into a definition about a single bidirectional switch (1).

REFERENCE SIGNS LIST

1 Bidirectional switch
2 Substrate
4 GaN layer
5 AlGaN layer
61 First p-type $Al_{x1}Ga_{1-x1}N$ Layer (where $0 \leq x1 < 1$)
62 Second p-type $Al_xGa_{1-x2}N$ Layer (where $0 \leq x2 < 1$)
8 Terminal
F1 First Direction
F2 Second Direction
G1 First Gate Electrode
G2 Second Gate Electrode
Iin Magnitude of Input Current
Isat Saturated Current
S1 First Source Electrode
S2 Second Source Electrode
TA1, TA2 Output Terminal
Vg1 First Gate Voltage
Vg2 Second Gate Voltage
101, 101f Bidirectional switch Device
300 Electrical Device (Multi-Level Inverter)
300a, 300b, 300c, 300d, 300e, 300f, 300g Electrical Device (Switch System)
302, 302a, 302b, 302c, 302d, 302e, 302f Control System

The invention claimed is:

1. An electrical device comprising:
a bidirectional switch device including a plurality of bidirectional switches and formed by connecting the plurality of the bidirectional switches in parallel; and
a control system configured to control the bidirectional switch device,
each of the plurality of bidirectional switches including:
  a substrate having electrical conductivity;
  a GaN layer formed over the substrate;
  an AlGaN layer formed on the GaN layer;
  a first source electrode, a first gate electrode, a second gate electrode, and a second source electrode, which are formed on or over the AlGaN layer;
  a first p-type $Al_{x1}Ga_{1-x1}N$ layer (where $0 \leq x1 < 1$) interposed between the first gate electrode and the AlGaN layer;
a second p-type $Al_{x2}Ga_{1-x2}N$ layer (where $0 \leq x2 < 1$) interposed between the second gate electrode and the AlGaN layer,
  a conductive die pad bonded to the substrate with an electrically conductive material; and
  a terminal formed integrally with the conductive die pad and used to connect the substrate to a fixed potential node,
each of the plurality of the bidirectional switches being switchable from one of a bidirectional ON state, a bidirectional OFF state, a first diode state, or a second diode state to another, according to a combination of a first gate voltage and a second gate voltage applied to the first gate electrode and the second gate electrode, respectively, each of the plurality of the bidirectional switches allowing bidirectional currents to flow in a first direction and a second direction, respectively, when operating in the bidirectional ON state, cutting off the bidirectional currents when operating in the bidirectional OFF state, allowing a current to flow in the first direction when operating in the first diode state, and allowing a current to flow in the second direction when operating in the second diode state, and
the control system being configured to apply the first gate voltage and the second gate voltage to the first gate electrode and the second gate electrode, respectively, in each of the plurality of the bidirectional switches such that in each of the plurality of the bidirectional switches, a saturated current when each of the plurality of bidirectional switches is operating in either the first diode state or the second diode state has its current value reduced to less than magnitude of an input current supplied to the bidirectional switch device.

2. The electrical device of claim 1, wherein
the control system is configured to apply the first gate voltage and the second gate voltage to the first gate electrode and the second gate electrode, respectively, in each of the plurality of the bidirectional switches such that in each of the plurality of the bidirectional switches, a saturated current when each of the plurality of bidirectional switches is operating in either the first diode state or the second diode state has its current value reduced to less than a rated current of each of the plurality of bidirectional switches.

3. The electrical device of claim 1, wherein
the control system is configured to apply the first gate voltage and the second gate voltage to the first gate electrode and the second gate electrode, respectively, in each of the plurality of the bidirectional switches such that in each of the plurality of the bidirectional switches, a saturated current when each of the plurality of bidirectional switches is operating in either the first diode state or the second diode state has its current value reduced to less than magnitude of a current flowing when each of the plurality of bidirectional switches operates in the bidirectional ON state.

4. The electrical device of claim 1, wherein
the plurality of bidirectional switches includes three or more bidirectional switches, and
the control system is configured to apply the first gate voltage and the second gate voltage to the first gate electrode and the second gate electrode, respectively, in each of the plurality of the bidirectional switches such that in each of two bidirectional switches out of the three or more bidirectional switches, a total amount of current flowing when each of the plurality of bidirectional switches is operating in the first diode state or the second diode state has its value reduced to less than magnitude of an input current supplied to the bidirectional switch device.

5. A multi-level inverter comprising:
a bidirectional switch device including a plurality of bidirectional switches and formed by connecting the plurality of the bidirectional switches in parallel; and
a control system configured to control the bidirectional switch device,
each of the plurality of bidirectional switches including:
a substrate having electrical conductivity;
a GaN layer formed over the substrate;
an AlGaN layer formed on the GaN layer;
a first source electrode, a first gate electrode, a second gate electrode, and a second source electrode, which are formed on or over the AlGaN layer;
a first p-type $Al_{x1}Ga_{1-x1}N$ layer (where $0 \leq x1 < 1$) interposed between the first gate electrode and the AlGaN layer;
a second p-type $Al_{x2}Ga_{1-x2}N$ layer (where $0 \leq x2 < 1$) interposed between the second gate electrode and the AlGaN layer,
a conductive die pad bonded to the substrate with an electrically conductive material; and
a terminal formed integrally with the conductive die pad and used to connect the substrate to a fixed potential node,
each of the plurality of the bidirectional switches being switchable from one of a bidirectional ON state, a bidirectional OFF state, a first diode state, or a second diode state to another, according to a combination of a first gate voltage and a second gate voltage applied to the first gate electrode and the second gate electrode, respectively, each of the plurality of the bidirectional switches allowing bidirectional currents to flow in a first direction and a second direction, respectively, when operating in the bidirectional ON state, cutting off the bidirectional currents when operating in the bidirectional OFF state, allowing a current to flow in the first direction when operating in the first diode state, and allowing a current to flow in the second direction when operating in the second diode state, and
the control system being configured to apply the first gate voltage and the second gate voltage to the first gate electrode and the second gate electrode, respectively, in each of the plurality of the bidirectional switches such that in each of the plurality of the bidirectional switches, a saturated current when each of the plurality of bidirectional switches is operating in either the first diode state or the second diode state has its current value reduced to less than magnitude of an input current supplied to the bidirectional switch device.

* * * * *